(12) United States Patent
Pfeifer et al.

(10) Patent No.: US 6,822,850 B2
(45) Date of Patent: **\*Nov. 23, 2004**

(54) LAMINATED BUS BAR FOR USE WITH A POWER CONVERSION CONFIGURATION

(75) Inventors: David W. Pfeifer, PepperPike, OH (US); John M. Kasunich, Mayfield Heights, OH (US); Richard Sheppard, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/455,673

(22) Filed: Jun. 5, 2003

(65) Prior Publication Data

US 2004/0062006 A1 Apr. 1, 2004

Related U.S. Application Data

(63) Continuation-in-part of application No. 10/260,064, filed on Sep. 27, 2002, now abandoned, which is a continuation-in-part of application No. 10/260,783, filed on Sep. 27, 2002, now Pat. No. 6,721,181, which is a continuation-in-part of application No. 10/260,056, filed on Sep. 27, 2002.

(51) Int. Cl.$^7$ ................................................ H02B 1/20
(52) U.S. Cl. ........................ 361/611; 361/637; 363/144; 174/72 B
(58) Field of Search .................................. 361/611, 637, 361/648, 624, 699, 704; 363/144, 147

(56) References Cited

U.S. PATENT DOCUMENTS

| | | |
|---|---|---|
| 3,776,305 A | 12/1973 | Simmons |
| 4,093,024 A | 6/1978 | Middleton |
| 4,635,709 A | 1/1987 | Altoz |
| 4,646,202 A | 2/1987 | Hook et al. |
| 4,727,454 A | 2/1988 | Neidig et al. |
| 4,727,455 A | 2/1988 | Neidig et al. |
| 4,884,168 A | 11/1989 | August et al. |
| 4,998,181 A | 3/1991 | Haws et al. |
| 5,579,217 A | * 11/1996 | Deam et al. ................. 363/144 |
| 5,623,399 A | * 4/1997 | Ishii et al. ................... 363/132 |
| 5,631,821 A | 5/1997 | Muso |
| 5,804,761 A | * 9/1998 | Donegan et al. ............ 174/15.1 |
| 5,814,909 A | 9/1998 | Yamada et al. |
| 5,828,554 A | * 10/1998 | Donegan et al. ............. 361/707 |
| 5,915,463 A | 6/1999 | Romero et al. |
| 5,925,929 A | 7/1999 | Kuwahara et al. |
| 5,930,135 A | 7/1999 | Janko |
| 5,966,291 A | 10/1999 | Baumel et al. |
| 5,978,220 A | 11/1999 | Frey et al. |
| 6,002,580 A | * 12/1999 | LeVantine et al. ........... 361/634 |
| 6,031,751 A | 2/2000 | Janko |
| 6,137,169 A | 10/2000 | Pace |

(List continued on next page.)

OTHER PUBLICATIONS

Power Electronics Technology, Jan. 2003, P. Zacharias, et al. pp 14–20.

*Primary Examiner*—Boris Chervinsky
(74) *Attorney, Agent, or Firm*—Quarles & Brady LLP; William R. Walbrun

(57) ABSTRACT

An apparatus for linking together power switching devices having intra-converter connection terminals to form a power conversion assembly, the apparatus comprising a planar bus bar including positive and negative DC bus layers and insulating layers that insulate each of the DC bus layers, the bar also including at least a first external insulating layer that forms a first external surface of the bar, the bar also forming at least first and second linking edges and first and second pluralities of linkages formed along the first and second linking edges, respectively, each linkage linked to one of the positive and negative DC bus layers and configured to be linkable to at least one of the power switching device intra-converter connection terminals, in some cases positive and negative DC bus linkages are also provided to render the conversion assembly extremely versatile.

24 Claims, 19 Drawing Sheets

U.S. PATENT DOCUMENTS

| | | |
|---|---|---|
| 6,166,937 A | 12/2000 | Yamamura et al. |
| 6,219,245 B1 | 4/2001 | Nagashima et al. |
| 6,236,566 B1 | 5/2001 | Regnier et al. |
| 6,326,761 B1 | 12/2001 | Tareilus |
| 6,327,165 B1 * | 12/2001 | Yamane et al. ............. 363/132 |
| 6,340,851 B1 | 1/2002 | Rinaldi et al. |
| 6,367,543 B1 | 4/2002 | Calaman et al. |
| 6,414,867 B2 | 7/2002 | Suzuki et al. |
| 6,442,023 B2 | 8/2002 | Cettour-Rose et al. |
| 6,529,394 B1 | 3/2003 | Joseph et al. |
| 6,580,609 B2 | 6/2003 | Pautsch |
| 6,618,278 B2 * | 9/2003 | Suzuki et al. ............... 363/144 |
| 6,729,383 B1 | 5/2004 | Cannell et al. |
| 2001/0040027 A1 | 11/2001 | Tooyama et al. |
| 2002/0029876 A1 | 3/2002 | Fast |
| 2002/0043361 A1 | 4/2002 | Saito et al. |
| 2003/0036806 A1 | 2/2003 | Schienbein et al. |

* cited by examiner

LAMINATED BUS BAR FOR USE WITH A POWER CONVERSION CONFIGURATION

CROSS-REFERENCE TO RELATED APPLICATIONS

This application is a continuation-in-part of U.S. patent application Ser. No. 10/260,064 which was filed on Sep. 27, 2002, abandoned and which is titled "Compact Liquid Converter Assembly", is a continuation-in-part of U.S. patent application Ser. No. 10/260,783 which was filed on Sep. 27, 2002 now U.S. Pat. No. 6,721,181, and which is titled "Elongated Heat Sink For Use In Converter Assemblies" and is a continuation-in-part of U.S. patent application Ser. No. 10/260,056 which was filed on Sep. 27, 2002 and which is titled "Compact Liquid Cooled Heat Sink".

STATEMENT REGARDING FEDERALLY SPONSORED RESEARCH OR DEVELOPMENT

Not applicable.

BACKGROUND OF THE INVENTION

The field of the invention is power converters and more specifically converter configurations including heat sinks that reduce the overall space required to accommodate the configurations.

It is well known that variable speed drives of the type used to control industrial electric motors include numerous electronic components. Among the various electronic components used in typical variable-speed drives, all generate heat to a varying degree during operation. Typically, high-power switching devices such as IGBTs, diodes, SCRs and the like as well as storage devices such as capacitors are responsible for generating most of the heat in a variable-speed drive. It is for this reason, therefore, that most variable-speed drives include a heat sink(s) upon which the power switching devices are mounted. The heat sink(s) conducts potentially damaging heat from assembly components.

Selecting the size and design of a heat sink for a particular variable speed drive is somewhat of a challenge. First, a designer must be aware of the overall characteristics of the motor and drive pair. Second, the designer must understand the industrial application in which the motor and drive pair will be used, including the continuous and peak demands that will likely be placed on the motor and drive by the load. Third, the designer must accommodate, in the design, certain unexpected conditions that would deleteriously affect the heat transfer capability of the heat sink such as unexpectedly high ambient temperatures, physical damage to the heat sink such as mechanical damage, or a build up of a debris layer, as examples. Fourth, the heat sink(s) must be physically dimensioned so as to fit into the space allotted per customer requirements, cabinet or enclosure size, or the like.

In the past, air-cooled heat conducting plates were used to transfer thermal energy from electronic parts to the ambient air. These were passive heat-transfer devices and were generally formed of a light-weight aluminum extrusion including a set of fins. As a general rule, heat transfer effectiveness is based on the temperature differential between the power devices and the ambient air temperature. Of course, in order to provide adequate heat conduction, heat sinks of this type oftentimes are necessarily large and, therefore, bulky and expensive. If high ambient conditions exist, the heat sink becomes ineffective or useless as heat removal cannot be accomplished regardless of the size of the heat sink. If the variable speed drive was in an enclosed space the heat removed from the drive would need to be exhausted or conditioned for recirculation.

By forcing air over fins defined on the heat-conducting plate (e.g., an aluminum extrusion), improved cooling efficiency can be realized. Large blower motors are often used for this purpose. However, as the fins defined in the aluminum extrusions become dirty or corroded during use, the heat sinks become less effective or useless altogether. Blower motors cannot be used in environments where air cleanliness would clog filtration. Therefore, air conditioning equipment is often added to internally circulate and cool the air that is passed over the heat sink fins.

Liquid cooled heat sinks or cold plates have also been used for some applications but with limited success. Generally, a liquid cooled heat sink includes a series of chambers or channels that are formed internally within a sink body member that is formed of material (e.g., copper or aluminum) that readily conducts heat. The body member includes at least one mounting surface for receiving heat generating devices. The channels are typically configured so that at least one channel section is formed adjacent each surface segment to which a heat generating device is mounted—typical channel configurations are serpentine. A coolant liquid is pumped through the channels from one or more inlet ports to one or more outlet ports to cool the sink member and hence conduct heat away form the heat generating devices.

The industry has developed several ways in which to manufacture liquid cooled heat sinks and, each of the different ways to manufacture has different costs associated therewith. For instance, a liquid cooled sink can be constructed by forming a desired serpentine copper conduit path for liquid flow, placing the serpentine conduit construct within a sink mold, pouring molten liquid aluminum into the mold and allowing the molten aluminum to cool. While this manufacturing process has been used successfully, liquid molding processes are very difficult to control and the incidences of imperfect and or non-functioning product have been relatively high.

One other sink manufacturing process that has proven useful includes cutting a at least one channel out of a sink body member, hermetically sealing (e.g., vacuum brazing) a cover member to the body member to cover the channel and then forming an inlet and an outlet that open into opposite ends of the channel. This two part sealing process is much less expensive than the conduit-molten process described above.

When designing any liquid cooled heat sink several factors have to be considered including heat dissipating effectiveness, volume required to accommodate a resulting converter, and cost. With respect to heat dissipation, in the case of a power conversion assembly, there are typically several different heat generating devices that are similarly constructed and that operate in a similar fashion to convert power. For instance, as well known in the controls arts, an AC to DC rectifier typically includes a plurality of power switching devices that are arranged to form a bridge assembly. In the case of a three phase supply and load, the bridge assembly includes three phases, a separate switching phase for each of the three supply and load phases. Here, an exemplary phase may include first and second power switching devices linked at a common node to an associated supply line where the other terminals of the first and second switches are linked to positive and negative DC busses, respectively. A controller is configured to control all of the three phases of the bridge together to convert the three phase AC supply voltage to a DC potential across the positive and negative DC busses.

In a similar fashion, a three phase inverter assembly typically includes three separate phases that link positive and negative DC busses to three load supply lines. In the case of an inverter, each phase typically includes first and second power switching devices that are linked in series between the positive and negative DC busses with the common node between the first and second inverter switches linked to an associated phase of the load. Where the supply and load voltages are large, some rectifier/inverter converter assemblies may include several three phase bridges linked together thereby reducing the load handling of each switching device.

In the case of a rectifier-inverter conversion assembly, a drive circuit is provided that controls all of the switching devices together to create desired three phase output voltages to drive a load linked thereto. In this case, it is imperative that the switching devices operate in characteristic and substantially similar ways to simplify what is, by its very nature, an already complex switching scheme. For this reason, converter designers typically select switching devices having generally known operating characteristics (i.e., that operate within a range) to configure their conversion assemblies.

Nevertheless, as also well known, most switching devices have operating characteristics that are, at least in part, affected by the environments in which the devices operate. Specifically, for the purposes of the present invention, it should be appreciated that switching device operating characteristics change as a function of temperature. For instance, an internal switch resistance has been known to change as a function of temperature which in turn affects the voltage drop across the switch. While each voltage drop change that occurs may seem insignificant, because rectifier and inverter switches are typically turned on and off very rapidly, the affect of changing device drop has been shown to be appreciable.

The problems associated with voltage drop variance are compounded where similar switching devices are operated at different temperatures and is especially acute where control schemes operate to simultaneously control all three conversion assembly phases together to generate load voltages. Thus, for instance, where one switching device is several degrees hotter than another switching device, the result may be unbalanced phase voltages and hence imperfect load control (e.g., non-smooth motor rotation) which increases overall system wear and can cause system damage over time.

For this reason, one challenge when designing a heat sink for use with a converter assembly has been to provide essentially identical heat dissipating capacity to each converter switching device so that device temperatures are essentially identical during system operation. The problem here is that coolant temperature rises as the coolant absorbs heat along its path through a sink member so that power switching devices relatively near an inlet port along a serpentine coolant path are cooled to a greater degree than switching devices down stream from the inlet port. One solution that reduces the heat dissipating capacity differential between similar switching devices has been to provide a heat sink where the spacing between a cooling liquid inlet and each of the sink surfaces to which switching devices are mounted is similar. For instance, where a configuration includes twenty four power switching devices, instead of mounting the switching devices to the sink in a pattern that tracks a single serpentine cooling conduit path, the switching devices may be mounted on sink member mounting surface to form six rows of four switching devices each where each of the six rows is fed by a separate one of six liquid coolant inlet ports—here a manifold may serve each of the six inlet ports (see generally FIG. 23 in U.S. Pat. No. 6,031,751 (hereinafter "the '751 patent") entitled "Small Volume Heat Sink/Electronic Assembly" which issued on Feb. 29, 2000 and which is incorporated herein by reference). Thus, in this case, coolant from each of the six inlet ports passes by four separate heat generating devices and device cooling will be relatively more uniform. This solution to reduce the device temperature differential will be referred to hereinafter as a matrix spacing solution.

One other solution that reduces the heat dissipating capacity differential between switching devices mounted to a sink member has been to provide a serpentine path that passes by each heat generating device more than once so that the overall cooling affect of devices is similar. For instance, assume twelve switching devices are mounted to a sink member mounting surface to form two rows of six devices each and that a single serpentine path is configured to include a first linear run that passes adjacent the first row of devices, a first 180 degree turn, a second linear run that passes adjacent the second row of devices, a second 180 degree turn, a third linear run that again passes adjacent the second row of devices, a third 180 degree turn and a fourth linear run that passes a second time by the first row of devices to an outlet.

Here, in theory, the first linear run should include the coolest coolant, the second linear run should include the second coolest coolant and so on so that the coolant temperatures through the first and fourth linear runs (i.e., adjacent the devices in the first row) should average and the coolant temperatures though the second and third linear runs (i.e., adjacent the devices in the second row) should also average and the two average temperatures should be similar (see generally FIG. 2 in the '751 patent). This solution to reduce the device temperature differential will be referred to hereinafter as an averaging solution.

While the averaging solution and the matrix spacing solution work in theory, in reality, each of these solutions have had some problems regarding temperature differential. With respect to the matrix spacing solution, in the example above, the fourth device along each of the six separate coolant paths is warmer than the first device along the same path as liquid passing by the first three devices along the path heats up when heat is absorbed along the path. Thus, while better than sinks that align devices along a single serpentine cooling conduit path, the matrix solution still results in a temperature differential.

With respect to the averaging solution, it has been determined that, despite multi-pass designs, at least some temperature differential still exists between devices spaced at different locations along the coolant conduit path. In addition, in some cases, cooling capacity may vary over the heat dissipating surface of each heat generating device. This intra-device dissipating differential may occur as a multi pass path necessarily requires that the coolest pass (i.e., the first pass by a device) be positioned along one side of a dissipating surface so that another one or more passes that include relatively warmer coolant can be positioned along the other side of the dissipating surface.

With respect to volume (i.e., the second factor above to consider when designing a heat sink), as with most electronics designs, all other things being equal, smaller is typically considered better. Thus, some prior converter configurations have provided sink members that either facilitate stacking of relatively short devices adjacent elongated devices (see FIG. 19 in the '751 patent) or, in the alternative, alignment of similar dimensions of different devices (see FIG. 13 in the '751 patent).

For instance, the '751 patent recognizes that, in addition to power switching devices, converter configuration capacitors also often generate excessive heat that should be dissipated to ensure proper operation. The '751 patent also recognizes that capacitors typically have a length dimension perpendicular to their heat dissipating surface that is much longer than the thickness dimensions of typical switching devices perpendicular to the device dissipating surfaces and that the switching devices typically have a length dimension that is similar to the capacitor length dimension. In this case, in one embodiment, the '751 patent recognizes that overall converter configuration size can be reduced by providing an L shaped sink member having two legs that form a 90° angle, mounting the capacitors to an inside surface of one of the legs and within the space defined by the two leg members and mounting the switching devices to the outside surface of the other of the leg members thereby aligning the similar capacitor and device length dimensions.

With respect to cost, unfortunately, where an L shaped heat sink member or, for that matter, where a sink member having sections that reside along other than a single plane is required to stack or align capacitors with switching devices, the relatively inexpensive two part sealing process described above becomes much more difficult to use. This is because the two part sealing process generally includes vacuum sealing a flat cover member over a channel forming body member. When the channel must reside in more than one plane and requires a more complex cover member, tolerances required to provide a suitable cover member would be extremely difficult to meet and the sealing process would be difficult to perform effectively.

Thus, where the sink member must reside in two or more planes to facilitate stacking and/or aligning, the more expensive molten-conduit process would likely be employed where the conduit is formed into the desired channel shape and molten aluminum or the like is poured into a mold there around. For this reason prior stacking and aligning configurations have proven to be relatively expensive to manufacture and often are not suitable given cost constraints.

Also, with respect to cost, often the last converter design consideration is how system components will be electrically linked together to form a converter topology. One particularly advantageous and robust type of linking assembly is referred to generally as a laminated bus bar. As its label implies, a laminated bus bar typically includes a plurality of metallic sheets of laminate that are layered together with insulators between adjacent laminate sheets. Vias are formed within the laminated assembly where links are to be made to capacitor and switching device terminals. The vias automatically link the devices and capacitors up in a desired fashion to provide an intended converter topology (e.g., rectifier, inverter, rectifier-inverter, etc.).

Laminated bus bar cost is generally a function of the amount of material required to construct the bus, the number of laminate layers required to support a configuration and the overall complexity of the required laminate member where minimal material, minimal layers and minimal contours (i.e., bends in the laminates) are all advantageous. Unfortunately, providing a configuration that uses minimal laminate material, requires minimal layering and restricts the laminate to a single plane is extremely difficult given the sink member configurations required to minimize overall configuration size and provide essentially uniform heat dissipating capacity to all switching devices mounted to the sink. For example, where devices are arranged in rows and columns to provide similar distances between channel inlets and devices down stream therefrom, typically a large number of laminate layers and a correspondingly complex labyrinth of vias are required to link components together. As another instance, where switching device lengths are aligned with similarly dimensioned capacitor lengths the lamination bus typically requires one or, more often, several bends to accommodate connection terminals that reside in disparate planes. In either of these two cases (i.e., many layers or several laminate bends) the amount of material required to configure a laminated bus bar can be excessive and hence unsuitable for certain applications.

Yet one other cost consideration related to converter assemblies has to do with component versatility or the ability to use converter components in more than one conversion assembly. Component versatility is particularly important with respect to the more expensive component types such as, for example, the heat sink assembly, the laminated bus bar, etc. In this regard, overall system costs can be reduced by designing sinks and laminated bus bars that can be used with various device and capacitor types. For instance, assume that a first converter assembly includes a first type of switching device, a first type of capacitor, a first type of sink member and a first type of laminate bar. Also assume that the sink, devices and a capacitors are dimensioned such that when the capacitors and devices are mounted to the sink, the capacitors connection terminals are on the same plane as the device connection terminals. Here, the first laminate bus bar type can be planar and hence relatively inexpensive.

Next assume that a designer wants to swap out a second capacitor type for the first type in the assembly where the second capacitor type has a thickness between its dissipating surface and its connection terminals that is different than a similarly measures thickness of the first capacitor type. In this case, when the capacitors are swapped, the capacitor and device terminals will no longer reside within the same plane and a different, perhaps custom designed, laminate will be required to accommodate the change. In the alternative, the sink design may be altered to accommodate the change in device and capacitor terminal planes although this solution would be relatively expensive. Similar problems occur when different switching devices are swapped into assemblies.

On a higher level, instead of relying on component versatility to reduce costs, if demand for a converter assembly having certain operating characteristics is high enough, a complete modular converter assembly can be efficiently (e.g., cost effectively) designed and manufactured. While high volume exists for certain small conversion assemblies, unfortunately, larger and more complex assemblies typically are not sold in volumes that justify modular, pre-manufactured, designs—there just is not enough demand for complex larger configurations.

Even where large scale conversion assemblies having similar operating capabilities are in relatively high demand, often these large scale assemblies require a relatively large space within an application. In many applications, while space allotted for converter components may be sufficient, the allotted space may require a specially designed assembly. In other words, the space layout for a converter assembly in a first application may be different than the space layout for a converter assembly in a second application despite similar conversion requirements (e.g., power, ripple limitations, etc.). This spatial limitation on converter assembly versatility further limits volume requirements for large scale complex converter assemblies. Thus, at the high end, converter assemblies are often custom designed to meet operating and spatial layout requirements of specific applications and hence are expensive.

Thus, it would be advantageous to have a heat sink assembly that is relatively inexpensive to manufacture and yet provides substantially similar heat dissipating capacity to all devices mounted thereto. In addition, it would be advantageous if a sink assembly of the above kind could be used with a simplified laminate design and be used to configure relatively compact converter assemblies. Moreover, it would be advantageous if the sink assembly could be versatile and hence used with other converter components that have many different dimensions. Furthermore, it would be advantageous if a converter topology configurable by using the sink assembly or a set of the sink assemblies had many different uses such as, as an inverter, as a rectifier, as a DC-DC converter, as an AC-AC converter, etc., so that per converter unit costs could be reduced appreciably by configuring versatile relatively large scale converter topologies.

BRIEF SUMMARY OF THE INVENTION

It has been recognized that relatively compact and inexpensive converter configurations can be configured by using an elongated liquid cooled heat sink to cool power switching devices. More specifically, it has been recognized that, where switching devices are mounted in a single row to a sink member mounting surface, the sink can be used to configure minimal volume converter configurations. In at least one embodiment of the invention, the sink mounting surface has a width dimension that is substantially similar to a width dimension of switching devices to be mounted thereto with the device width dimensions aligned with the mounting surface width dimension. This single row limitation has several configuration advantages described below.

It has also been recognized that, with certain types of refrigerant, the cooling capacity differential along a cooling channel appears to be exacerbated along the channel length. For instance, the cooling capacity differential appears to be relatively pronounced in the case of two phase refrigerants such as R-134a and R-123. As the label implies, two phase refrigerants change from a liquid to a gas when heat is absorbed and hence, generally, absorb a greater amount of heat, due to the endothermic nature of the phase change, than conventional single-phase liquid refrigerants such as water—hence two phase refrigerants are generally preferred in high efficiency heat sinks.

Moreover, it has been recognized that, unfortunately, as two-phase refrigerants absorb heat and change phase from liquid to gas, vapor bubbles are formed within the liquid that accumulate on the internal surfaces of the heat sink and form gas pockets. The gas pockets on the surface of the channel block refrigerant from contacting the channel surface and hinder device heat absorption by the refrigerant. Thus, the channel surfaces on which gas pockets form end up becoming hot spots on the channel surfaces and the temperatures of devices attached adjacent thereto rise.

Because the vapor bubbles are formed by heat absorption and because coolant relatively further down stream from an inlet is warmer than coolant more proximate the inlet, relatively more vapor bubbles are formed down stream from the inlet than proximate the inlet thereby causing more gas pockets to form down stream which increases the temperature differential along the channel length. Thus, it has been determined that, while coolant temperature accounts for some of the temperature differential along a coolant channel length, much of the temperature differential is actually due to different amounts of gas accumulating along different sections of the channel—the gas having an insulating effect between the channel surfaces and the coolant passing thereby. Based on these realizations it should be appreciated that the temperature differential problem is exacerbated where sink channels are extended.

According to several embodiments of the invention, protuberances of a character, quantity and size that increase turbulence within sink channels to a point where the turbulence either prohibits gas pockets from forming on the channel surfaces or dislodges or breaks up gas pockets that form on the channel surfaces, are provided on at least one of the channel surfaces. It has been found that when such protuberances are provided within a channel, the channel can have an extended length without causing excessive temperature differentials there along. More specifically, it has been determined that the channel length can, in at least one embodiment, extend substantially along an entire sink length where the sink, as indicated above, has a length to accommodate a single row of switching devices. For instance, where a converter configuration includes twenty four switching devices, the twenty four devices can be arranged in a single row along the sink member mounting surface where the channel extends along substantially the entire sink length from an inlet to an outlet.

It has also been determine that, in at least some embodiments of the invention, the sink member can be juxtaposed so that the channel inlet is below the channel outlet and, more specifically, so that the channel inlet is directly vertically below the channel outlet. Here, dislodged or broken up gas pockets, being lighter than the refrigerant, are aided by buoyancy in their movement toward the outlet at the top of the sink channel.

By providing an elongated sink-device assembly including devices mounted in a single row to an elongated sink member, overall converter cost can be reduced. In this regard, the single channel sink member can be manufactured using the two piece sealing method described above where the channel is bore out of a body member, a cover member is hermetically sealed over the channel and inlet and outlet ports that open into the channel are formed.

In addition, cost is reduced with the inventive elongated sink-device assembly as a simplified laminated bus bar can be used with the sink-device assembly. In this regard, where capacitors are juxtaposed to one side of the switching devices and with capacitor terminals and device terminals positioned within a common connection plane, the distances between capacitor terminals and the device terminals that the capacitor terminals are to be linked to are reduced appreciably so that less material is required to make terminal connections. Moreover, because capacitor terminals and the device terminals to which the capacitor terminals are to be linked may be positioned proximate each other, none of the laminates have to pass over other devices disposed intermediate the connecting terminals and therefore simpler laminate and associated via designs can be employed that include relatively small numbers (e.g., 3) of laminate layers.

Consistent with the above, at least one embodiment of the invention includes an electronic converter assembly comprising a liquid cooled heat sink member having a sink length dimension, at least one mounting surface and first and second oppositely facing lateral surfaces, the mounting surface and first and second lateral surfaces forming first and second lateral edges, respectively, the sink member also forming at least one internal channel that extends substantially along the entire sink length, an inlet and an outlet that open into opposite ends of the channel, a plurality of power switching devices mounted side by side to the mounting surface thereby forming a single device row that extends substantially along the sink length, each device including intra-converter terminals that are substantially within a single connection plane, a plurality of capacitors, each capacitor including capacitor connection terminals, the capacitors linked for support to and adjacent the sink member with the capacitor terminals juxtaposed substantially within the connection plane and a linkage assembly including a plurality of conductors that link the capacitor terminals to the intra-converter terminals to form a power conversion topology.

In one embodiment each power switching device includes first and second oppositely facing linking edges and wherein the intra-converter terminals form the first linking edge proximate the first lateral edge of the sink member.

Some embodiments further include a bracket member mounted to the sink member and extending past the first surface, the capacitors mounted to the bracket member for support. More specifically, the mounting surface may be a first mounting surface and the sink member may include a second mounting surface that faces in a direction opposite the first mounting surface wherein the bracket member is mounted to the second mounting surface.

In some embodiments the bracket member includes a proximate member mounted to the second mounting surface, an intermediate member linked to and forming a substantially 90 degree angle with the proximate member and extending substantially parallel to the first lateral side of the sink member and generally away from the sink member and a distal member forming a substantially 90 degree angle with the intermediate member and extending generally away from the sink member, the capacitors mounted to the distal member. Moe specifically, in one embodiment each of the devices includes a heat dissipating surface adjacent the mounting surface and is characterized by a device thickness dimension between the connection plane and the dissipating surface of the device, the first and second mounting surfaces are separated by a sink thickness, the intermediate member has an intermediate member length, each capacitor includes first and second oppositely facing ends and a length dimension between the first and second ends, the capacitor terminals extend axially from the first end of each capacitor and the second end of each capacitor is mounted to the distal member and, wherein, the combined sink thickness, device thickness and intermediate member length is substantially similar to the capacitor length dimension.

Each capacitor may have a heat conducting extension that protrudes from the second end of the capacitor and that is in conductive contact with the distal end of the bracket member. Here, the bracket member may be formed of a heat conducting material (e.g., aluminum or copper). In addition, here, the linkage assembly may include a substantially planar laminated bus bar.

In some embodiments the linkage assembly links the capacitors and power switching devices together to form an inverter while in other embodiments the linkage assembly may link the capacitors and switching devices to form a rectifier. In still other embodiments the linage assembly may link the capacitors and switching devices to form both a rectifier and an inverter.

The first and second lateral edges of the mounting surface may form a sink member width and a device width between the first and second linking edges may be substantially similar to the sink member width.

In some embodiments the channel inlet is disposed below the channel outlet. More specifically, the channel inlet is substantially directly vertically below the channel outlet. In some embodiments the extension members may be provided that extend into the channel thereby increasing turbulence in liquid pumped from the inlet to the outlet.

The invention also includes an electronic converter assembly comprising a heat sink member having a sink length dimension, at least one mounting surface and first and second oppositely facing lateral surfaces, the mounting surface and first and second lateral surfaces forming first and second lateral edges, respectively, a plurality of power switching devices mounted side by side to the mounting surface to form a single device row that extends along the sink length, each device including intra-converter terminals juxtaposed substantially within a single connection plane, each device also including first and second oppositely facing linking edges having a device width therebetween, a bracket member mounted to the sink member and extending past the first lateral surface, a plurality of capacitors, each capacitor including capacitor connection terminals, the capacitors mounted to the bracket member adjacent the sink member with the capacitor terminals substantially within the connection plane and a linkage assembly including a plurality of conductors that link the capacitor terminals to the intra-converter terminals to form a power conversion topology.

In some embodiments the sink member forms at least one internal channel that extends substantially along the entire sink length and an inlet and an outlet that open into opposite ends of the channel and, wherein, the converter configuration is juxtaposed so that the channel is substantially vertically oriented. More specifically, the channel inlet may be substantially vertically below the channel outlet.

While there are many advantages associated with arranging power switching devices in a single line, it has also been recognized that, under certain circumstances, such an arrangement may not function well. For example, where conversion power requirements are increased, the number of switching devices required to handle the power level must also be increased. At some point, even with an efficient and well designed liquid cooled sink, the heat generated by the devices mounted thereto may cause a temperature differential along the sink length (e.g., from inlet to outlet). Thus, there is an operational or functional limitation to liquid cooled sink length.

In addition to the functional limitation on sink length, in many applications there are space limitations that have to be considered when designing a converter configuration. For instance, while long sink and switching configurations may be suitable for some applications, in many applications, space allotted for the converter assembly is rectilinear and has a short maximum dimension (e.g., the length is more similar to the width).

According to one aspect of the present invention, a high power converter configuration includes two liquid cooled sink members, each member providing a mounting surface that may receive several (e.g., four) power switching device modules arranged in a line along its length. Here, a single linking assembly links the switching devices in the modules together between DC buses to form conversion bridge assemblies. In addition, in at least some embodiments, capacitors are mounted to a single bracket member which is in turn mounted to the sink members such that intra-converter module connection terminals and capacitor connection terminals are within the same plane and a single planar laminated bus bar links all module switches to form converter bridges. Where a long space is provided for the conversion assembly, the sink members may be mounted end to end along one side of the bracket member. Where a shorter relatively more rectilinear space is provided for the conversion assembly, the bracket member may be mounted between and separating the first and second sink members on opposite sides of the laminated bus bar. Thus, compact high power conversion assemblies can be configured with minimal component count and simple component design.

In the case of a two sink configuration, each of the two sinks may have the same design as the liquid cooled sink member described above in the context of a converter assembly including only a single liquid cooled sink member. Thus, converter assemblies having different capabilities can be configured using the same component types thereby increasing component versatility and reducing per component costs.

According to another aspect of the present invention, in at least some embodiments of the invention, positive and negative DC tabs or studs are linked to the positive and negative DC buses of a laminated bus bar. The DC tabs increase complex converter assembly versatility and thereby to reduce per assembly costs. For instance, an exemplary complex converter assembly may include first and second sets of power switching device modules where each module includes six switching devices (i.e., each module independently includes all of the switching devices required to construct a complete converter bridge). A laminated intra-converter bus bar links all of the device modules together so that a plurality of separate converter bridges are formed between positive and negative DC buses where each bridge includes first, second and third switch pairs, each pair arranged in series between the DC buses. Each of three bus bars in a first inter-converter bar set may be linked to the positive and negative DC buses in the laminated bar via the switches in at least one bridge leg (e.g., each inter-converter bar is linked to at least one common node between the two switches in a single switch pair). Here, DC tabs extend from the positive and negative DC buses in the laminate.

The above complex converter topology can be employed to provide various different conversion functions. For example, the first inter-converter bar set may be linked to an AC source, the second inter-converter bar set may be linked to a load and the switching devices in the first and second module sets may be controlled so that the topology provides AC-AC conversion (i.e., as a rectifier and an inverter)—in this case the DC tabs are not employed. As another example, the first inter-converter bar set may be linked to an AC source, the second bar set may not be linked to either a source or a load and the DC tabs may then be employed as a DC source for some other application. Similarly, each of the first and second inter-converter bar sets may be linked to AC sources and each of the first and second module sets may be controlled as rectifiers to provide a higher DC voltage at the DC tabs. As one other example, an external DC source may be provided at the DC tabs and both or only one of the module sets may be controlled as inverters to provide AC output voltages at associated inter-converter bars. Still another example may include, where each module set includes more than one module, controlling only a sub-set of the first or second set modules to rectify or inverter power where lesser power levels are required.

It should be appreciated that, while the industry generally has looked upon relatively large conversion topologies with a jaundiced eye because of a lack of versatility and because of limitations regarding accommodating space layouts, by combining the inventive liquid cooled sink member concepts with specific component juxtapositions and the DC tab concept, far smaller and far more versatile complex converter assemblies can be designed and manufactured.

While various aspects of the present invention render complex converter topologies cost effective and small enough to be suitable for many applications, one additional problem occurs when multiple power switching device modules are combined to increase rectifier and/or inverter power handling capabilities. In this regard, as known in the switching device industry, despite efforts to manufacture switching devices that have identical operating characteristics, unfortunately, operating characteristics for devices of the same type are often slightly different such that turn on and off periods for the switching devices vary within a "tolerance range". In the case of converter control, a huge number of switching operations occur every second and the cumulative effect of the switching differences has been known to appreciably and adversely affect conversion functions.

It has been recognized that, while switches of a specific type may have operating characteristics that fall within some specified range, the range of operating characteristics for switches mounted on the same switching device module is typically smaller than the range of characteristics of devices on different switching device modules. For instance, in the case of first and second modules of the same type, the operating characteristics of the six switching devices on the first module will typically be within a first small range and the operating characteristics of the six switching devices on the second module will typically be grouped within a second small range where the first and second ranges are different.

According to another aspect of the present invention, inter-converter bus bars have been designed wherein each bus bar links to switching devices on several different switching device modules so that the different switching device operating characteristics can be averaged among the different converter phases. For instance, in at least some embodiments of the invention where two modules are used to link first, second and third inter-converter bus bars to DC buses, each of the bus bars is linked to a separate switching device pair in each of the modules (e.g., a first bar may be linked to the common node of a first switching device pair in each of the first and second modules, a second bar may be linked to the common node of a second switching device pair in each of the first and second modules and a third bar may be linked to the common node of a third switching device pair in each of the first and second modules). Where additional modules are used to link the inter-converter bars to the DC buses, each bar is linked to a device pair in each of the additional modules.

Consistent with the above, the present invention also includes an electronic converter assembly comprising first and second liquid cooled heat sink members, each sink member having at least one sink mounting surface, first and second pluralities of power switching devices, each switching device including connection terminals, the first and second pluralities of switching devices mounted to the first and second sink mounting surfaces, respectively and a planar laminated bus bar including a plurality of conductors that link the power switching device connection terminals to form a power conversion topology.

In some embodiments further include a bracket member and a plurality of capacitors, the bracket member having at least one bracket mounting surface and rigidly mounted to each of the first and second sink members, the capacitors mounted to the bracket mounting surface and the laminated bar further linking the switching device connection terminals and the capacitors to form the conversion topology. Here, the bracket member may be mounted between the first and second sink members and first lateral surfaces of the first and second sink members may face each other. Moreover, each capacitor may include a mounting end and a capacitor connection terminal at an end opposite the mounting end, may be mounted to the bracket mounting surface at the mounting end and may be dimensioned such that the connection terminal is substantially coplanar with the switching device connection terminals.

In at least some embodiments the bracket member includes first and second lateral end members mounted to the second mounting surfaces of the first and second sink members, respectively, first and second intermediate members linked to and forming substantially 90 degree angles with the first and second proximate members and extending substantially parallel to the first lateral sides of the first and second sink members and generally away from the first and second sink members, respectively, and a central member linked between the first and second intermediate members, forming a substantially 90 degree angle with each of the intermediate members and extending generally between the first and second sink members, the capacitors mounted to the central member. Here, each of the devices includes a heat dissipating surface adjacent the mounting surface and is characterized by a device thickness dimension between the connection plane and the dissipating surface of the device, the first and second mounting surfaces on each of the sink members are separated by a sink thickness, each of the first and second intermediate members has an intermediate member length, each capacitor includes first and second oppositely facing ends and a length dimension between the first and second ends, the capacitor terminals extend axially from the first end of each capacitor and the second end of each capacitor is mounted to the central member and, wherein, the combined sink thickness, device thickness and intermediate member length is substantially similar to the capacitor length dimension.

In some cases the first sink member has a first length dimension and forms a first internal channel along its length dimension between an inlet and an outlet and wherein the second sink member has a second length dimension and forms a second internal channel along its length dimension between an inlet and an outlet. The sink members may be oriented such that the first sink member inlet is below the first sink member outlet and the second sink member inlet is below the second sink member outlet. More specifically, the sink members may be oriented such that the channels are substantially vertically oriented.

In some embodiments each of the first and second sink members has first and second oppositely facing lateral surfaces, the mounting surfaces and first and second lateral surfaces form first and second lateral edges, respectively, on each of the sink members, the bracket member mounted to the sink members such that the first lateral surfaces of the first and second sink members oppose each other. In a particularly detailed configuration the first plurality of power switching devices is mounted side by side on the first sink mounting surface forming a single row that extends substantially along the first sink length, each device in the first plurality including intra-converter terminals juxtaposed within a first connection plane and wherein the second plurality of power switching devices is mounted side by side on the second sink mounting surface forming a single row that extends substantially along the second sink length, each device in the second plurality including intra-converter terminals that are also juxtaposed within the first connection plane wherein the intra-converter connection terminals are the terminals linked to the laminated bus bar.

The intra-converter terminals of each device may be located proximate the first lateral edge of the sink member to which the device is mounted. Similarly, the inter-converter terminals of each device may be located proximate the second lateral edge of the sink member to which the device is mounted and are within the first connection plane.

The invention also includes an electronic converter assembly comprising first and second liquid cooled heat sink members, each sink member having at least one sink mounting surface and a length dimension, each sink member forming an internal substantially vertical channel between an inlet and an outlet where the inlet is below the outlet, a bracket member rigidly linked to the first and second sink members, first and second pluralities of power switching devices mounted to the first and second sink mounting surfaces, respectively, each switching device including intra-converter connection terminals and a linkage assembly including a plurality of conductors that link the power switching device intra-converter connection terminals to form a power conversion topology. In some embodiments the bracket member is mounted between the first and second sink members.

The invention also includes a method for configuring a converter assembly, the method comprising the steps of providing first and second liquid cooled heat sink members where each member has a mounting surface and has a length dimension, each mounting surface having first and second lateral edges that extend along the length dimension and that face in opposite directions, mounting a bracket member to the sink members such that the sink member length dimensions are substantially parallel, providing first and second pluralities of power switching devices where each device includes inter-converter connection terminals to be linked to a source or a load and intra-converter connection terminals to be linked to either a positive or a negative DC bus, mounting the first and second pluralities of switching devices to the first and second sink member mounting surfaces with the intra-converter and the inter-converter connection terminals proximate the first and second edges of the mounting surfaces, respectively and linking the intra-converter connection terminals to positive and negative DC buses to form the converter topology.

In some cases the step of mounting the bracket member to the sink members includes mounting the bracket member between the first and second sink members such that the first edges of the sink members face each other. In some cases the method further includes the step of orienting the first and second sink members such that the length dimensions are substantially vertically oriented. In some embodiments the step of linking includes providing a laminated bus bar including positive and negative DC bus conducting layers and linking the intra-converter connection terminals to the positive and negative layers to configure the topology.

The invention also includes an apparatus for linking together power switching devices having intra-converter connection terminals to form a power conversion assembly, the apparatus comprising a planar laminated bus bar including positive and negative DC bus layers and insulating layers that insulate each of the DC bus layers, the bar also including at least a first external insulating layer that forms a first external surface of the bar, the bar also forming at least first and second linking edges and first and second pluralities of linkages formed along the first and second linking edges, respectively, each linkage linked to one of the positive and negative DC bus layers and configured to be linkable to at least one of the power switching device intra-converter connection terminals.

In some of the embodiments each of the linkages is a linking tab. In some cases the first and second edges of the bus bar face in opposite directions. In some embodiments the bus bar is substantially rectilinear. In some embodiments the first and second edges are straight and the first plurality of linkages are aligned along the first straight edge and the second plurality of linkages are aligned along the second straight edge. In some cases the first and second linking edges are vertically aligned.

Some cases include first and second external linking vias that open to the positive and negative DC bus layers, respectively. Some embodiments further include positive and negative DC connection terminals that extend through the first and second vias and are linked to the positive and negative DC bus layers, distal ends of the DC connection terminals exposed and connectable to at least one of a DC source and a DC load.

According to one aspect the apparatus is for linking at least first and second bridge assemblies together with capacitors to form a conversion device wherein, each of the linkages in the first plurality is linked to at least one of the intra-converter connection terminals of the first bridge assembly and each of the linkages in the second plurality is linked to at least one of the intra-converter connection terminals of the second bridge assembly.

The invention further includes a three phase electronic converter assembly comprising at least a first heat sink member having a mounting surface, first and second X phase converter bridge assemblies, each bridge assembly including a plurality of power switching devices, the first bridge assembly forming first through Xth external linkage terminals and the second bridge assembly forming (X+1)th through 2Xth external linkage terminals, each linkage terminal linkable to one phase of at least one of an X phase source and an X phase load, the switching devices mounted to the mounting surface of the at least first sink member, a plurality of capacitors and a laminated bus bar including a positive DC bus, a negative DC bus and a plurality of insulating layers that insulate the positive and negative DC buses and form an external insulating layer, the linkage assembly linking the plurality of capacitors and each of the bridge assemblies between the positive and negative DC buses, the bar forming first and second external linking vias that open to the positive and negative DC buses, respectively.

The invention moreover includes a three phase electronic converter assembly comprising a first heat sink member having a mounting surface, a second heat sink member having a mounting surface, first and second X phase converter bridge assemblies, each bridge assembly including a plurality of power switching devices, the first bridge assembly forming first through Xth external linkage terminals and the second bridge assembly forming (X+1)th through 2Xth external linkage terminals, each linkage terminal linkable to one phase of at least one of an X phase source and an X phase load, the first assembly switching devices mounted to the first sink member mounting surface and the second assembly switching devices mounted to the second sink member mounting surface, a plurality of capacitors and a laminated bus bar including a positive DC bus, a negative DC bus and a plurality of insulating layers that insulate the positive and negative DC buses and form an external insulating layer, the linkage assembly linking the plurality of capacitors and each of the bridge assemblies between the positive and negative DC buses, the external insulating layer forming first and second vias that open to the positive and negative DC buses, respectively.

Consistent with another aspect of the invention, an electronic converter assembly may comprise a first heat sink member having at least a first mounting surface and a length dimension, a plurality of power switching device modules wherein each module includes at least four separate power switching devices, the modules mounted to the first sink mounting surface such that the switching devices are aligned along the length of the sink member, each switching device including inter-converter connection terminals linkable to at least one of a load and a source and intra-converter connection terminals linkable, each intra-converter connection terminal linkable to at least one of a positive and a negative DC bus, first, second and third bus bars, each bus bar linked to the inter-converter connection terminals of at least first and second pairs of the power switching devices where the at least first and second pairs of power switching devices linked to specific ones of the bus bars are from different switching device modules and a linkage assembly including a plurality of conductors that link the intra-converter connection terminals of the power switching devices to form a power conversion topology.

Some embodiments further include fourth, fifth and sixth bus bars and, wherein, the linkage assembly links the intra-converter connection terminals to form at least first and second converter bridges, the first, second and third bus bars linked to the inter-converter connection terminals of the switching devices that form the first converter bridge and the fourth, fifth and sixth bus bars linked to the inter-converter connection terminals of the switching devices that form the second converter bridge.

In some cases the modules include at least first and second modules, each of the modules includes first, second, third, fourth, fifth and sixth switching devices aligned in a row where the first and second devices form a first device pair, the third and fourth devices form a second device pair and the fifth and sixth devices form a third device pair on each module, the linkage assembly linking the intra-converter connection terminals of each of the first, third and fifth switching devices in each module to a positive DC bus and linking the intra-converter connection terminals of each of the second, fourth and sixth switching devices in each module to a negative DC bus, the first bus bar linked to the inter-converter connection terminals of the first pair of devices of each module, the second bus bar linked to the inter-converter connection terminals of the second pair of devices of each of each module and the third bus bar is linked to the inter-converter connection terminals of the third pair of devices of each of each module. In other cases the modules further include a third module that includes first, second, third, fourth, fifth and sixth switching devices, the linking assembly further linking the intra-converter connection terminals of each of the first, third and fifth switching devices in the third module to the positive DC bus and linking the intra-converter connection terminals of each of the second, fourth and sixth switching devices in the third module to the negative DC bus, the first bus bar also linked to the inter-converter connection terminals of the first and second switching devices of the third module, the second bus bar linked to the inter-converter connection terminals of the third and fourth switching devices of the third module and the third bus bar linked to the inter-converter connection terminals of the fifth and sixth switching devices of the third module. In still another case the modules further include a fourth module that includes first, second, third, fourth, fifth and sixth switching devices, the linking assembly further linking the intra-converter connection terminals of each of the first, third and fifth switching devices in the fourth module to the positive DC bus and linking the intra-converter connection terminals of each of the second, fourth and sixth switching devices in the fourth module to the negative DC bus, the first bus bar also linked to the inter-converter connection terminals of the first and second switching devices of the fourth module, the second bus bar linked to the inter-converter connection terminals of the third and fourth switching devices of the fourth module and the third bus bar linked to the inter-converter connection terminals of the fifth and sixth switching devices of the fourth module.

In some embodiments the first through fourth modules are a first module set, the apparatus further including a second heat sink member, a second module set and fourth, fifth and sixth bus bars, the second sink member having at least a first mounting surface and a length dimension, the second module set including fifth through eighth power switching device modules, the fifth through eighth modules mounted to the second sink mounting surface such that the switching devices that comprise the second module set are aligned along the length of the second sink member, the linkage assembly linking the intra-converter connection terminals of each of the first, third and fifth switching devices in each module to a positive DC bus and linking the intra-converter connection terminals of each of the second, fourth and sixth switching devices in each module to a negative DC bus, the fourth bus bar linked to the inter-converter connection terminals of the first and second switching devices on each of the fifth, sixth, seventh and eighth modules, respectively, the fifth bus bar linked to the inter-converter connection terminals of the third and fourth switching devices on each of the fifth, sixth, seventh and eighth modules, respectively, the sixth bus bar linked to the inter-converter connection terminals of the fifth and sixth switching devices on each of the fifth, sixth, seventh and eighth modules, respectively.

Some embodiments further include a bracket member and a plurality of capacitors, the bracket member rigidly mounted between and separating the first and second heat sink members and having a bracket mounting surface that faces in the same direction as each of the first and second sink mounting surfaces, the capacitors mounted to the bracket mounting surface and linked to the linkage assembly conductors to form a part of the conversion topology.

In some cases the first bus bar includes a first bus spine member and a plurality of first bus rib members linked to the first spine member and extending laterally therefrom, each of the first rib members linked to at least two of the inter-converter terminals on one of the device modules and linked to no more than two inter-converter terminals on each of the device modules, the second bus bar including a second bus spine member and a plurality of rib members linked to the second bus spine member and extending laterally therefrom, each of the second rib members linked to at least two of the inter-converter terminals on one of the device modules and linked to no more than two inter-converter terminal on each of the device modules, the third bus bar including a third bus spine member and a plurality of rib members linked to the third spine member and extending laterally therefrom, each of the third rib members linked to at least two of the inter-converter terminals on one of the device modules and linked to no more than two inter-converter terminal on each of the device modules. In some embodiments each of the modules includes first, second, third, fourth, fifth and sixth switching devices and, wherein, the first bus bar includes a separate rib member for each pair of first and second switching devices in each of the modules, the second bus bar includes a separate rib member for each pair of third and fourth switching devices in each of the modules and the third bus bar includes a separate rib member for each pair of fifth and sixth switching devices in each of the modules.

The invention further includes an electronic converter assembly comprising a heat sink member having at least a first mounting surface, a length dimension and first and second oppositely facing lateral surfaces that extend parallel to the length dimension, the mounting surface and first and second lateral surfaces forming first and second lateral edges, respectively, first, second, third and fourth power switching device modules wherein each module includes first, second, third, fourth, fifth and sixth separate power switching devices, each switching device including inter-converter connection terminals and intra-converter connection terminals that extend from the device in opposite directions, the modules mounted to the sink mounting surface such that the switching devices are aligned along the length of the sink member with the intra-converter connection terminals proximate the first lateral edge and the inter-converter terminals proximate the second lateral edge and first, second and third bus bars, each of the bus bars linked to a sub-set of the connection terminals of switching devices in at least two different device modules.

Other embodiments include an electronic converter assembly comprising a first heat sink member having at least a first mounting surface, a length dimension and first and second oppositely facing lateral surfaces that extend parallel to the length dimension, the mounting surface and first and second lateral surfaces forming first and second lateral edges, respectively, a second heat sink member having at least a first mounting surface, a length dimension and first and second oppositely facing lateral surfaces that extend parallel to the length dimension, the mounting surface and first and second lateral surfaces of the second sink member forming first and second lateral edges, respectively, first and second module sets, the first module set including first, second, third and fourth power switching device modules and the second module set including fifth, sixth, seventh and eighth power switching device modules wherein each module includes first, second, third, fourth, fifth and sixth separate power switching devices, each switching device including inter-converter connection terminals and intra-converter connection terminals that extend from the associated module in opposite directions, the modules in the first module set mounted to the first sink member mounting surface such that the switching devices are aligned along the length of the first sink member, the intra-converter connection terminals proximate the first lateral edge and the inter-converter terminals proximate the second lateral edge of the first sink member, the modules in the second module set mounted to the second sink member mounting surface such that the switching devices are aligned along the length of the second sink member, the intra-converter connection terminals proximate the first lateral edge and the inter-converter terminals proximate the second lateral edge of the second sink member, first, second, third, fourth, fifth and sixth bus bars, each of the first, second and third bus bars linked to the inter-converter connection terminals of switching devices in at least two different device modules in the first module set and each of the fourth, fifth and sixth bus bars linked to the inter-converter connection terminals of switching devices in at least two different device modules in the second module set and a linkage assembly linking the intra-converter connection terminals of the switches in each of the first, second, third, fourth, fifth, sixth, seventh and eighth modules together to form the converter topology.

The invention also includes a bus bar assembly for use with an electronic converter assembly having a plurality of switching device modules, each module including first, second and third pairs of power switching devices, each pair including a first device linked to a positive DC bus and a second device linked to a negative DC bus, the first and second devices of each pair having adjacent inter-converter connection terminals aligned along an edge of the sink member, the assembly comprising a first rigid bus bar linkable to the inter-converter connection terminals of the first pair of switching devices in each module, a second rigid bus bar linkable to the inter-converter connection terminals of the second pair of switching devices in each module and a third rigid bus bar linkable to the inter-converter connection terminals of the third pair of switching devices in each module.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

FIG. 1a is a schematic diagram of a rectifier configuration and corresponding controller while

FIG. 10a a schematic diagram of a rectifier configuration and corresponding controller while

DETAILED DESCRIPTION OF THE INVENTION

Figure 1A:
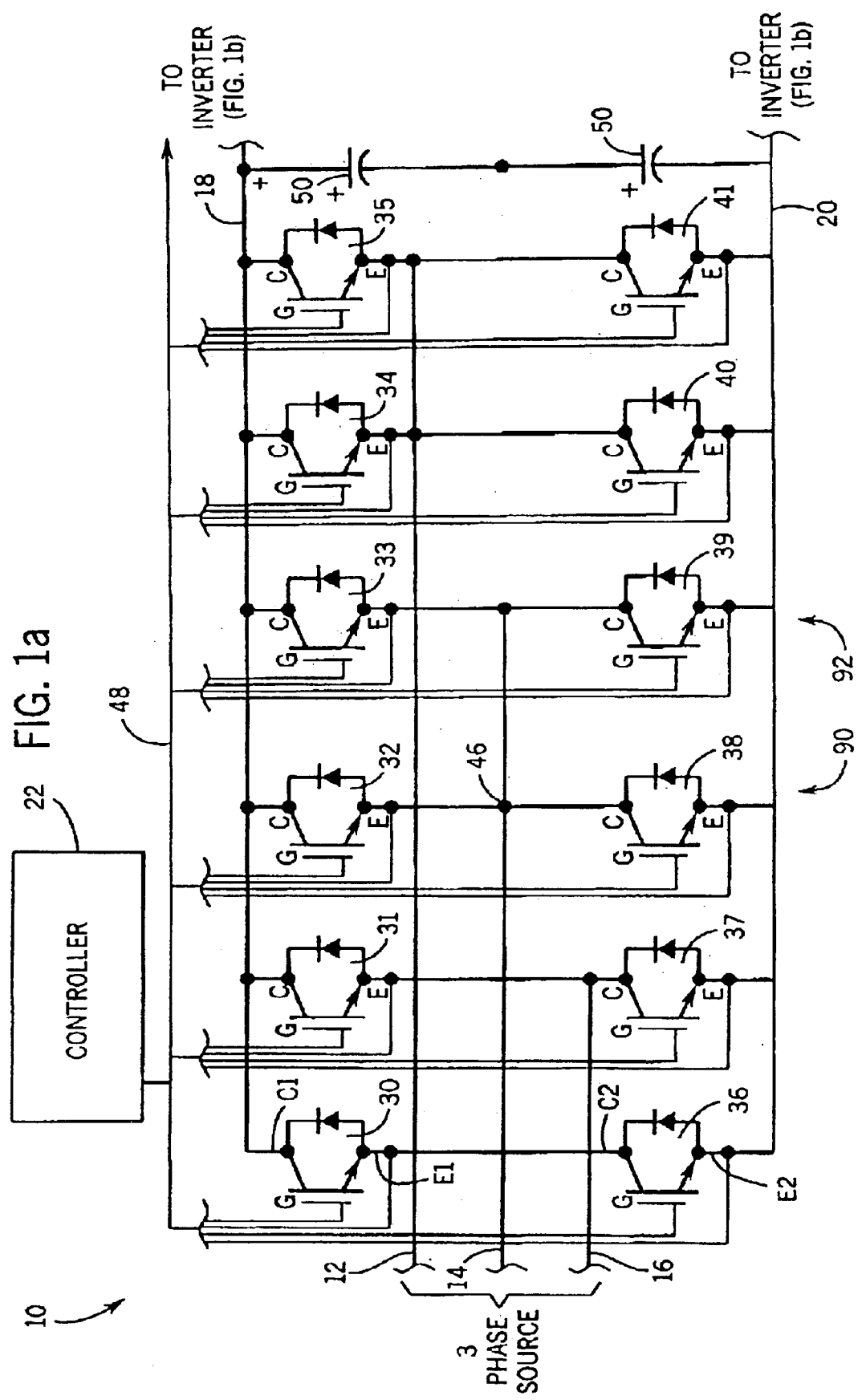

Referring now to the drawings where in like numerals correspond to similar elements throughout the several views and, more specifically, referring to FIGS. 1a and 1b, the present invention will be described in the context of exemplary motor control system 10 including a rectifier assembly generally illustrated in FIG. 1a which feeds an inverter assembly generally illustrated in FIG. 1b where each of the rectifier and inverter are controlled by a controller 22. As known in the controls industry, rectifier (FIG. 1a) receives three-phase AC voltage on input lines 12, 14 and 16 and converts that three-phase voltage to a DC potential across positive and negative DC buses 18 and 20, respectively. The DC buses 18 and 20 generally feed the inverter configuration (see again FIG. 1b) which converts the DC potential to three-phase AC voltage waveforms that are provided to a three-phase load via first, second and third inverter output lines 24, 26 and 28, respectively.

The rectifier assembly includes twelve separate switching devices identified by numerals 30–41. The switching devices 30–41 are arranged between the positive and negative DC buses 18 and 20, respectively, to provide six separate rectifier legs. Each rectifier leg includes two series connected switching devices that traverses the distance between the positive and negative DC buses 18 and 20, respectively. For example, a first rectifier leg includes switches 30 and 36 that are in series between positive bus 18 and negative bus 20, a second rectifier leg includes switches 31 and 37 that are series connected between buses 18 and 20, a third rectifier leg includes switches 32 and 38 that are series connected between buses 18 and 20, and so on. The nodes between switches in each rectifier leg are referred to as common nodes. One common node between switches 32 and 38 is identified by numeral 46.

Each of input lines 12, 14 and 16 is separately linked to two different common nodes. For example, as illustrated, line 14 is linked to common node 46 between switches 32 and 38 and is also linked to the common node (not numbered) between switches 33 and 39. In a similar fashion, input line 12 is linked to the common node between switches 34 and 40 and also to the common node between switches 35 and 41 while line 16 is linked to the common node between switches 30 and 36 and to the common node between switches 31 and 37. In FIG. 1a (and also FIG. 1b described below) switch emitters, collectors and gates are identified via E, C and G labels, respectively, with the collectors and emitters of switches 30 and 36 qualified by "1" and "2" sub-labels (e.g., E1, E2, C1, C2), to distinguish those emitters and collectors for additional explanation below.

A control bus 48 which represents a plurality of different control lines links controller 22 separately to each one of the rectifier switches 30–41 for independent control. Controller 22 controls when each of the switches 30–41 turns on and when each of the switches 30–41 turns off. Control schemes that may be used by controller 22 to convert the three-phase voltages on lines 12, 14 and 16 to a DC potential across DC buses 18 and 20 are well known in the conversion art and therefore will not be described herein detail. Rectifier legs that have their common nodes (e.g., 46) linked to the same input line are controlled in an identical fashion by controller 22. For example, referring still to FIG. 1*a*, each of switches 32 and 33 would be turned on and turned off at the same time by controller 22 and each of switches 38 and 39 would be turned on and turned off at the same times by controller 22 as the corresponding rectifier legs have the same common node 46 linked to line 14.

In addition to the components described above, the rectifier configuration illustrated in FIG. 1*a* also includes capacitors between DC buses 18 and 20 which are collectively identified by numeral 50. Although only two capacitors are illustrated, it should be appreciated that a larger number of capacitors would typically be employed in any type of rectifier configuration. Capacitors 50 reduce the ripple in the potential between lines 18 and 20 as well known in the art.

Figure 1B:
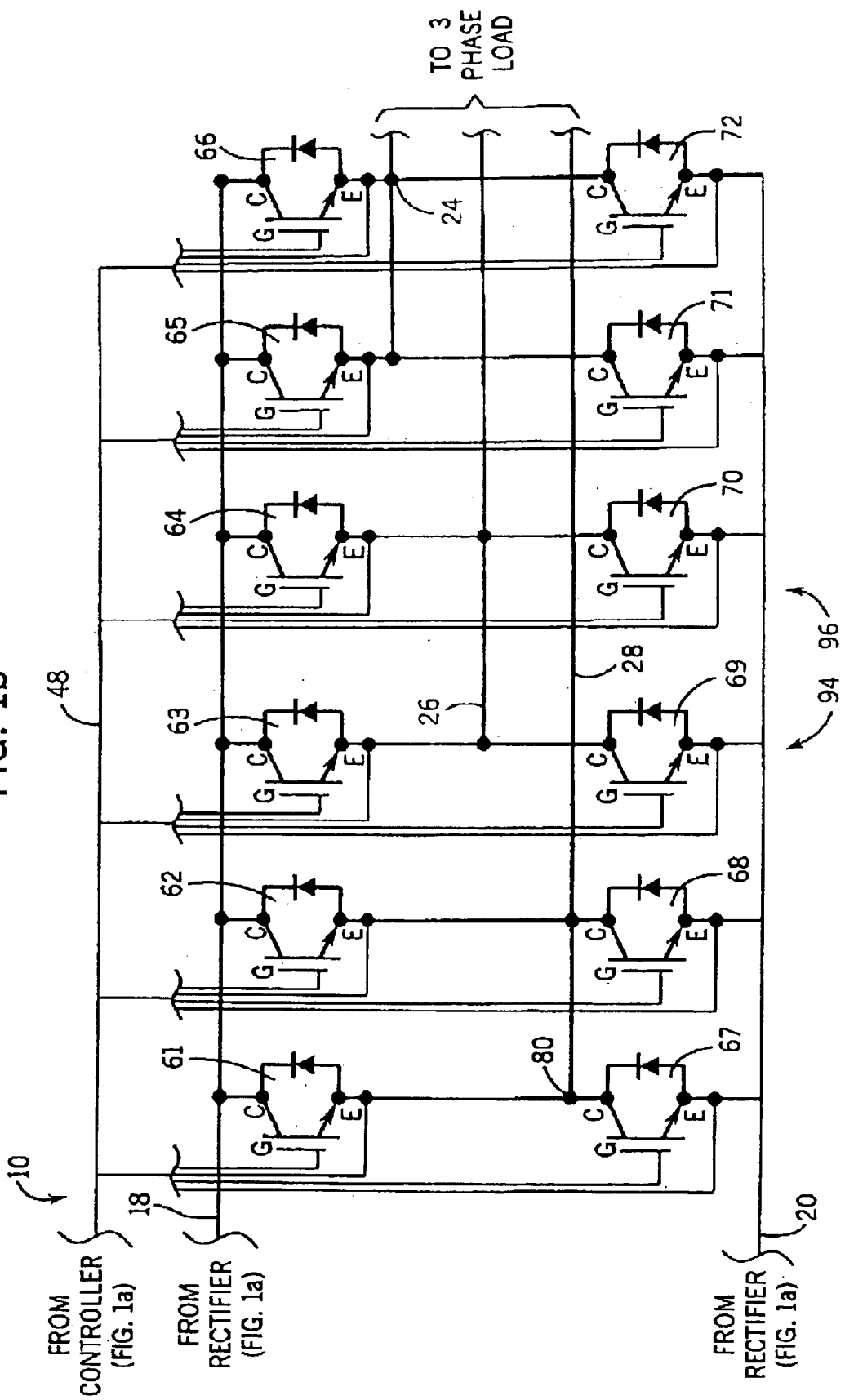
FIG. 1b is a schematic diagram of an inverter configuration.

Referring now to FIG. 1*b*, the inverter configuration illustrated, like the rectifier configuration of FIG. 1*a*, includes twelve separate switching devices identified by numerals 61–72. The switching devices 61–72 are arranged to form six separate inverter legs. Each inverter leg includes a pair of the switching devices 61–72 that is series arranged between the positive DC bus 18 and the negative DC bus 20. For example, a first inverter leg includes switches 61 and 67 series arranged between buses 18 and 20, a second inverter leg includes switches 62 and 68 series arranged between buses 18 and 20, a third leg includes switches 63 and 69 series arranged between buses 18 and 20, and so on.

Common nodes between inverter leg switch pairs are referred to hereinafter as common nodes. In FIG. 1*b*, an exemplary common node between switches 61 and 67 is identified by numeral 80. In the illustrated embodiment, each output line 24, 26 and 28 is linked to two separate inverter leg common nodes (e.g., 80). For example, output line 28 is linked to common node 80 between switches 61 and 67 and is also linked to the common node (not illustrated) between switches 62 and 68. Similarly, output line 26 is linked to the common node between switches 63 and 69 and also to the common node between switches 64 and 70 while output line 24 is linked to the common node between switches 65 and 71 and is also linked to the common node between switches 66 and 72.

The control bus 48 linked to controller 22 is also linked separate to each of the inverter switches 61–72 to independently control the turn on and turn off times of those switches. As in the case of the rectifier switches of FIG. 1*a*, controller 22 controls the switches of the inverter legs that have common nodes linked to the same output line in an identical fashion. To this end, referring still to FIG. 1*b*, because the common nodes (e.g., 80) corresponding to the first inverter leg including switches 61 and 67 and the second inverter leg including switches 62 and 68 are both connected to output line 28, the first and second inverter legs are controlled in a similar fashion so that each of switches 61 and 62 is turned on and turned off at the same times and each of switches 67 and 68 are turned on and off at the same times.

Referring to FIGS. 1*a* and 1*b*, the rectifier-inverter configuration includes commonly controlled switches so that the configuration can handle relatively high currents that may otherwise destroy the types of devices employed to configure the converters. In this manner relatively less expensive switches can be used to construct the converter assembly. The switches 30–41 used to configure the rectifier are typically identical and the switches 61–72 used to configure the inverter are typically identical. Depending on the configuration design, switches 30–41 may or may not be identical to switches 61–72.

Referring still to FIGS. 1*a* and 1*b*, switch manufacturers often provide power switching devices in prepackaged modules suitable to construct inverters and rectifiers. To this end, often, a complete 6-switch bridge will be provided as a separate and unique switching power package. Hereinafter it will be assumed that the 24 switches that comprise the rectifier and inverter in FIGS. 1*a* and 1*b* are provided in four separate 6-switch bridge packets where the first switching package includes switches 30, 31, 32, 36, 37 and 38, the second switch package includes switches 33, 34, 35, 39, 40 and 41, the third switch package includes switches 61, 62, 63, 67, 68 and 69 and the fourth switch package includes switches 64, 65, 66, 70, 71 and 72. Unless indicated otherwise, hereinafter, the first, second, third and fourth switch packages will be identified by numerals 90, 92, 94 and 96, respectively. Exemplary switch packets 90, 92, 94 and 96 are illustrated in FIG. 2 and are described in greater detail below.

Figure 2:
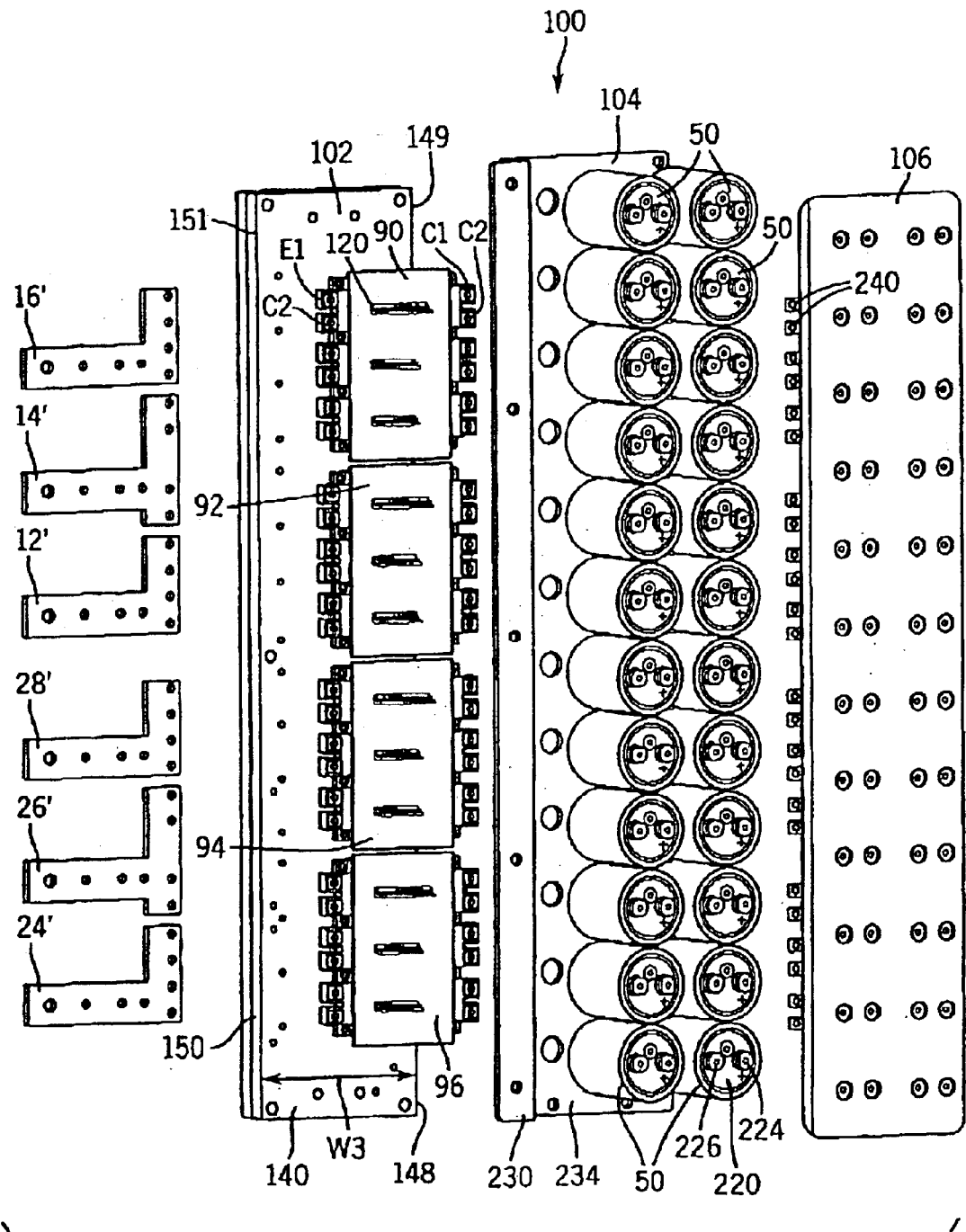
FIG. 2 is an exploded perspective view of a converter assembly according to one embodiment of the present invention.

Referring now to FIG. 2, an exploded perspective view of an exemplary rectifier/inverter converter assembly 100 is illustrated. Configuration 100 includes a heat sink member 102, the four power switching device modules 90, 92, 94 and 96 briefly described above, a bracket member 104, a plurality of capacitors collectively identified by numeral 50, a laminated bus bar 106 and a plurality of input and output bus bars identified by numerals 12', 14', 16', 28', 26', and 24'.

Figure 3:
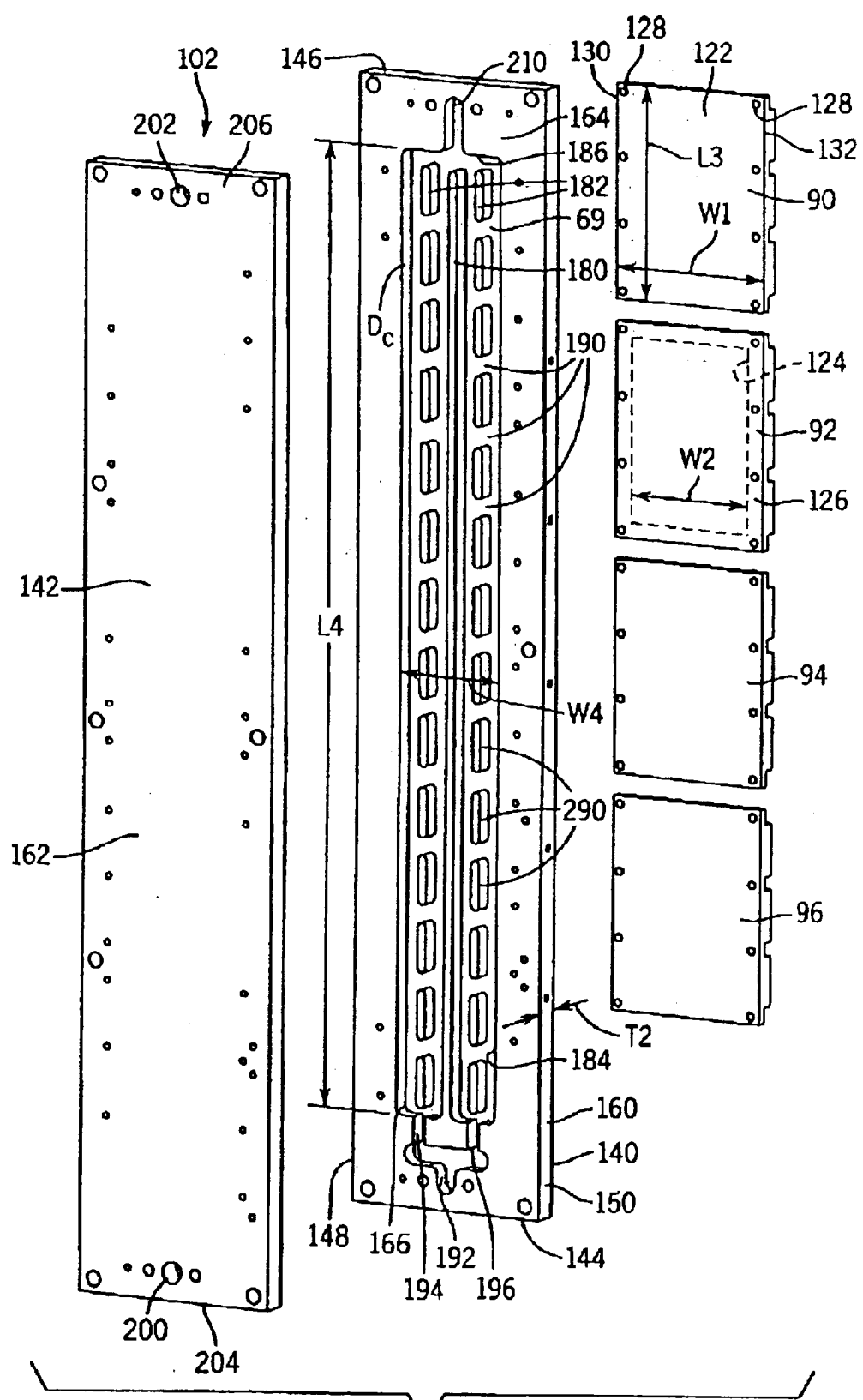
FIG. 3 is an exploded perspective view of the heat sink member and switch packages of FIG. 2.
Figure 5:
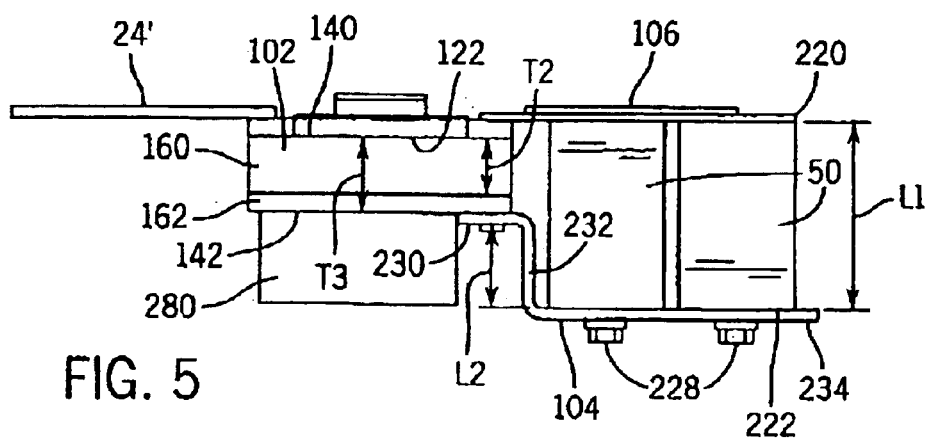
FIG. 5 is a bottom plan view of the conversion configuration of FIG. 4.

Each of switch packages 90, 92, 94 and 96 is similarly constructed and therefore, in the interest of simplifying this explanation, unless indicated otherwise, only switch package 90 will be described here in detail. Referring also to FIGS. 3 and 5, package 90 has a generally rectilinear shape having a length dimension L3, a width dimension W1 and a thickness dimension (not separately labeled). Although not illustrated in any of the drawings, device package 90 is characterized by a device thickness dimension that will be referred to herein by label T1 that is formed between the mounting or dissipating surface 122 (see FIG. 3) of the device and a connection plane defined by the top surfaces of the emitter and capacitor connection terminals that extend from the package housing. Package 90 has a first device or first linking edge 130 and a second device or second linking edge 132 that face in opposite directions and are separated by device width W1 as illustrated.

Referring still to FIG. 1*a* and also to FIG. 2, package 90 includes switching devices 30, 31, 32, 36, 37 and 38 that are arranged in a single row relationship where the emitters and collectors for each one of the switching devices extend from opposite side of package 90 and are generally separated by the device width W1. For example, the emitter E1 and collector C1 extend from opposite sides of package 90 while emitter E2 and collector C2 for switch 36 extend in opposite directions. Adjacent switches within package 90 have their emitters and collectors extending in different directions. For example, referring to FIG. 1a and FIG. 2, switch 36 in FIG. 1a has its emitter E2 and its collector C2 extending in directions opposite those of emitter E1 and collector C1 of the first switch 30 adjacent thereto in the package 90. Referring still to FIG. 3, package 90 is designed so that all of the emitter and collector terminals extend from the package housing within a single connection plane.

Hereinafter, unless indicated otherwise, switching device connection terminals that are linked to any of bus bars 12', 14', 16', 24', 26' or 28' will be referred to as inter-converter terminals because those terminals are connected through their respective bus bars to components outside the converter configuration. Similarly, any device package terminals that are linked to laminated bus bar 106 will be referred to hereinafter generally as intra-converter terminals as those terminals are linked to other components within the converter assembly.

Figure 4:
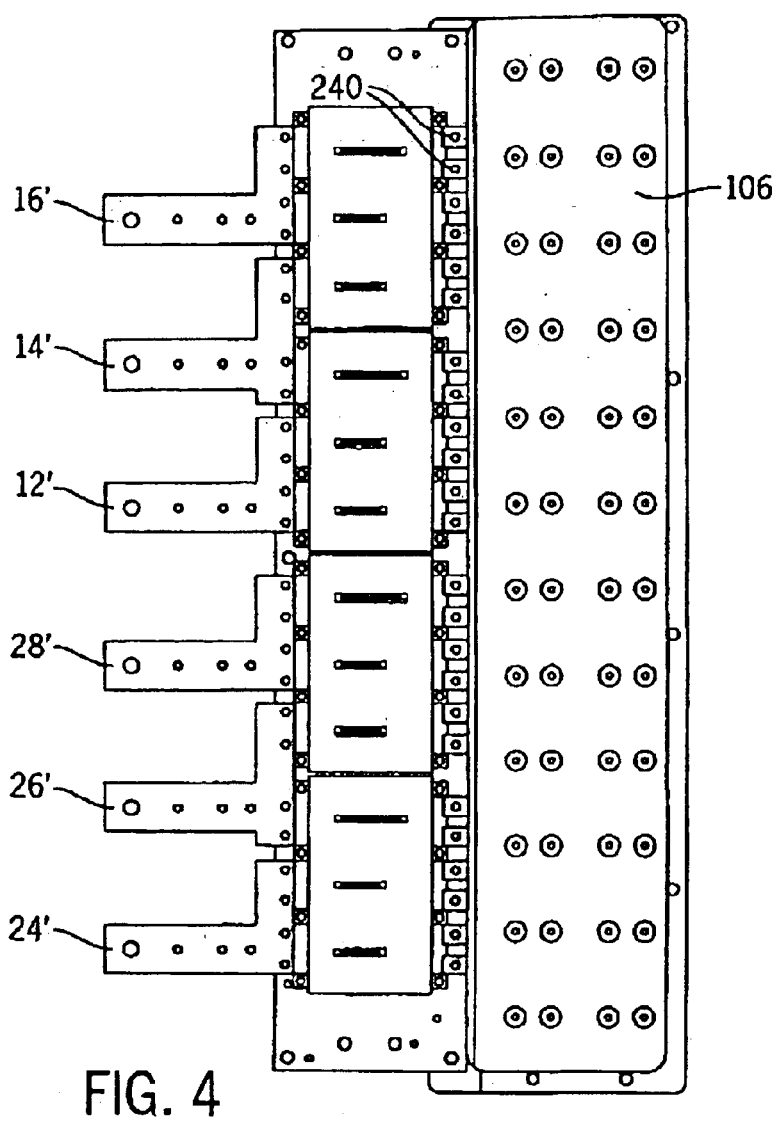
FIG. 4 is a side plan view of an assembled configuration consistent with FIG. 2.

As illustrated and described hereinafter, all of the inter-converter terminals extend from one side of package 90 while all of the intra-converter terminals extend from the opposite side of package 90 after the configuration in FIGS. 2 and 4 is assembled. In addition, after assembly, all of the intra-converter terminals for all of packages 90, 92, 94 and 96 extend in the same direction and form a connection line while all of the inter-converter terminals for packages 90, 902, 904 and 96 extend in the opposite direction and form a second connection line (see alignment generally in FIG. 2). The first and second connection lines form linking edges of the devices in the packages.

Control ports are provided on a top surface of package 90 to facilitate linking of control bus 48 to the devices provided within package 90. An exemplary control port in FIG. 2 is identified by numeral 120.

Package 90 has an undersurface 122 that is in thermal contact with the components inside the package housing that generate heat. Package 90 is designed so that surface 122 is substantially flat and can make substantially full contact with a heat sink surface when mounted thereto. It should be appreciated that, typically, only a portion of surface 122 may generate a relatively large percentage of the total amount of heat generated by the package and that the primary heat generating surface will likely be the central portion of surface 122. A heat generating segment 124 or dissipating surface of package 92 is illustrated and includes a space that is framed by an outer space 126 that surrounds the heat generating space 124. Space 124 generally corresponds to a space that is in direct contact with the package 90 components that conduct current and hence generate heat. Space 124 has a dissipating surface width dimension W2 associated therewith.

As best in seen in FIGS. 2 and 3, each package 90 includes a plurality of small apertures, two of which are identified by number 128, provided through the outer space 126 that frames the heat generating segment 124 (e.g., see device 92) as illustrated. Apertures 128 are provided to facilitate mounting packages 90, 92, 94 and 96 to sink member 102.

Referring still to FIG. 2, bus bars 12', 14', 16,' 28', 26' and 24' are to be linked to input lines 12, 14, 16 and output lines 28, 26 and 24 in FIGS. 1a and 1b, respectively. The linking relationship between bus bars and associated lines is highlighted by the bus bars being labeled with numbers that are identical to the line numbers to which they connect followed by a "'" indicator.

Each of input and output bus bars 12', 14', 16', 24', 26' and 28' are simply steel bars that either have an "L" shape or a "T" shape. Each bar 12', 14', 16', 24', 26' and 28' is designed to link input or output lines to a subset of four of the inter-converter terminals. For example, referring to FIGS. 1a and 2, L-shaped bus bar 16' is constructed and dimensioned so as to link together each of the emitter E1 for switch 30, the collector C2 for switch 36, the emitter for switch 31 and the collector for switch 37 and, to this end, includes four separate apertures for receiving some type of mechanical securing component (e.g., a bolt), a separate aperture corresponding to each one the emitters and collectors to be connect by bar 16'. Each of the other bus bars 12', 14', 24', 26' and 28' has a construction similar to bus bar 16' and therefore, in the interest of simplifying this explanation, the other bars will not be described here in detail. It should suffice to say that the bus bars link emitters and collectors among the switch packages 90, 92, 94 and 96 in a manner that is consistent with the schematics illustrated in FIGS. 1a and 1b.

Referring once again to FIG. 3 and also to FIG. 4, heat sink member 102 is an elongated and, in the illustrated embodiment, substantially rectilinear metallic (e.g., aluminum, copper, etc.) member that extends from a first end 144 to a second end 146, has first and second lateral surfaces 148 and 150, respectively, that face in opposite directions and extend along the entire length between ends 144 and 146 and also includes a first or first mounting surface 140 and a second oppositely facing mounting surface 142. As best illustrated in FIG. 2 (and also illustrated in FIG. 6), mounting surface 140 has a width dimension W3 that separates the lateral surfaces 148 and 150, respectively and has a length dimension L5. Mounting surface 140 and lateral surfaces 148 and 150 form first and second lateral edges 149 and 151, respectively. In at least one embodiment of the present invention, sink width W3 is substantially similar to the device package width W1 so that, as illustrated in FIG. 2, device packages 90, 92, 94 and 96 are mounted in a side-by-side single row fashion to be accommodated on mounting surface 140.

As best seen in FIG. 3, in at least one embodiment, sink member 102 includes two separate components that are secured together. The two components including a body member 160 and a cover member 162. Referring also to FIG. 5, body member 160 has thickness dimension T2 which is generally greater than the thickness dimension (not separately identified) of member 162. Together, body member 160 and cover member 162 have a thickness dimension T3.

Figure 6:
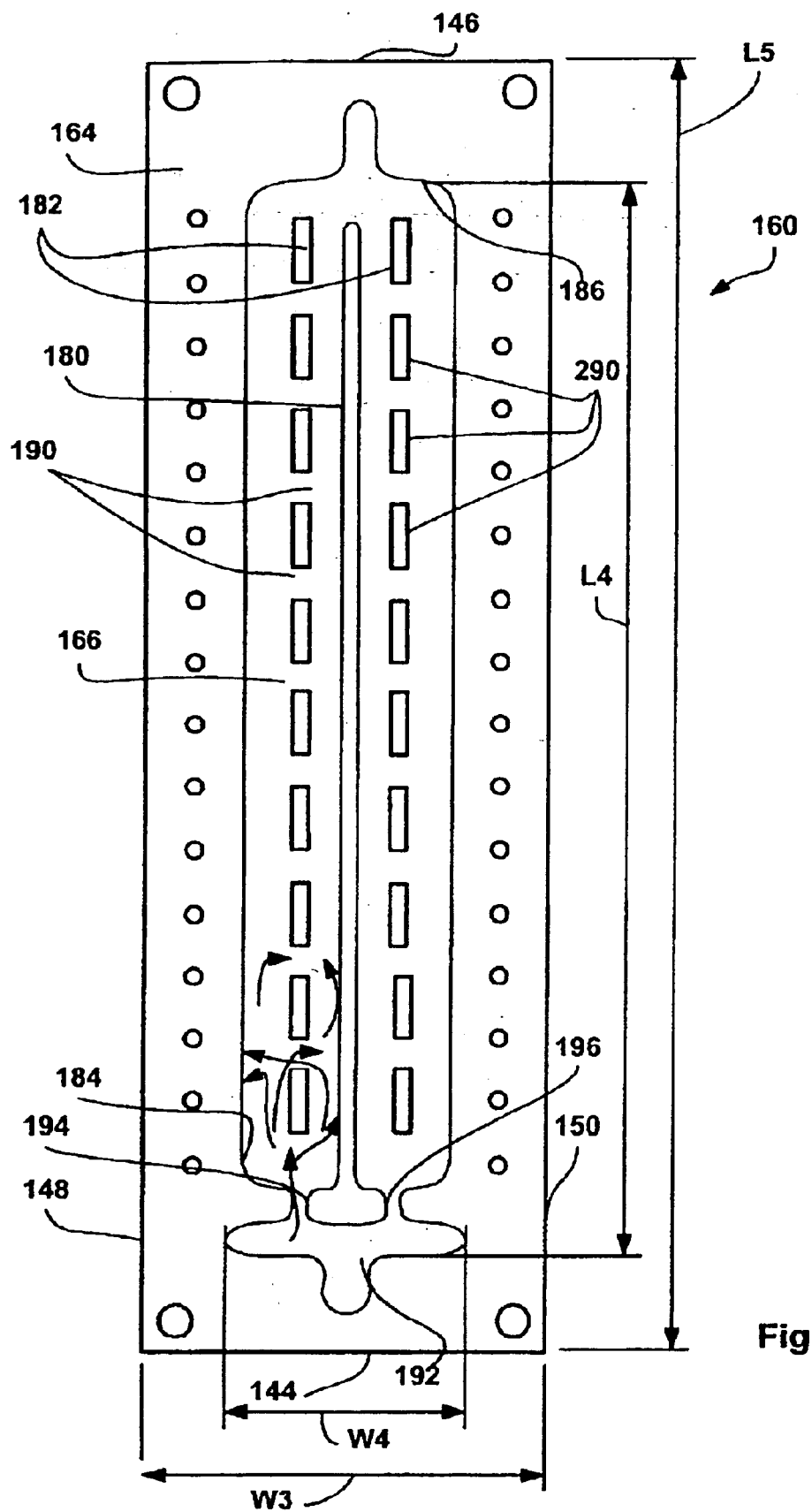
FIG. 6 is a plan view of the body member of the heat sink member of FIG. 3 and, in particular, showing the surface of the body member in which a coolant channel is formed.

As illustrated in FIGS. 3 and 6, body member 160 includes a second surface 164 opposite mounting surface 140 and forms a cavity 166 therein which extends substantially along the length of body member 160 from the first end 144 of the sink member to the second end 146. Cavity 166 has a cavity or channel depth Dc and forms a cavity or channel surface 69. In the illustrated embodiment, cavity 166 stops short of each of the ends 140 and 146, has a cavity length dimension L4 and has a cavity width or receiving dimension W4. Channel walls are provided on opposite sides of cavity 166 that have a thickness that is similar to the width dimension of the framing (i.e., the mounting flange) portion 126 of device surface 122 (see FIG. 3). The cavity width dimension W4, in at least some embodiments, is similar to the width dimension W2 of the primary heat generating portion or segment 124 of the package dissipating surface 122.

Cavity length dimension L4, in some embodiments, is substantially similar to a dimension formed by the oppositely facing edges of the dissipating surfaces of the device packages at the ends of the device row attached to the sink member. This dimension will be slightly smaller than the combined lengths (e.g., L3) of the device packages 90, 92, 94 and 96 in most cases. When cavity 160 is so dimensioned, a relatively small sink assembly is constructed which still provides effective cooling to devices attached thereto.

Referring still to FIGS. 3 and 6, within cavity 166, body member 160 includes three separate cavity dividing members including a central or first dividing member 180 and second and third lateral dividing members collectively identified by numeral 182. As its label implies, central dividing member 180 is positioned centrally within cavity 166 and generally divides the cavity into two separate channels. Central dividing member 180, in the illustrated embodiment, extends such that its distal end is flush with surface 164 of body member 160. In addition, central dividing member 180 extends all the way to a first end 184 of cavity 166 but stops short of a second end 186 of the cavity, the second end 186 being opposite first end 184.

Each of the second and third dividing members 182 is positioned on a different side of central member 180 and each stops short of both the first cavity end 184 and the second cavity end 186. In addition, each of dividing members 182 forms a plurality of openings so that liquid flowing on either side of the member can pass to the opposite side of the member. Exemplary openings are identified by numeral 190 in FIG. 3. Like central member 180, in the illustrated embodiment, each of the second and third lateral members 182 extends such that its distal end is flush with surface 164 of body member 160.

With openings 190 formed in each of dividing members 182, what remains of members 182 includes protuberances 290 that essentially break up the flow of coolant through the two channels formed within the cavity 166 as described in greater detail below. In the illustrated embodiment the protuberances 290 are essentially equi-spaced along the channel lengths.

At the first end 144 of the sink member, in the illustrated embodiment, body member 160 forms an inlet or receiving chamber 192 and first and second nozzle passageways 194 and 196, respectively. Inlet chamber 192 is formed between end 144 and cavity 166 and is connected to cavity 166 on one side of central member 180 by first nozzle passageway 194 and is connected to cavity 166 on the other side of central dividing member 180 by second nozzle passageway 196. Inlet chamber 192 has a relatively large cross-sectional area when compared to either of nozzle passageways 194 and 196 so that inlet chamber 192 can act as a reservoir for providing liquid under pressure to cavity 166 through the nozzle passageways 194 and 196. In the illustrated embodiment, each of the second and third lateral dividing members 182 is positioned such that the protuberance 290 closest to the inlet nozzle passageway 194 or 196 is aligned therewith. At second end 146 of body member 160, body member 160 forms a channel extension 210 having a width dimension that is less than the cavity width W4.

Body member 160 can be formed in any manner known in the art. One method for providing member 160 includes providing the member without cavity 166 and scraping metal out of surface 164 to provide a suitable cavity. Another method may be to form body member 160 in a mold. Other manufacturing processes are contemplated.

Cover member 162 is a substantially planar and rigid rectilinear member having a shape which mirrors the shape of surface 164. Member 162 forms an inlet opening 200 at a first end 204 and an outlet opening 202 at a second 206. The inlet 200 and outlet 202 are formed such that, when cover member 162 is secured to surface 164, inlet 200 opens into inlet channel 192 and outlet 202 opens into extension 210.

To secure cover member 162 in a hermetically sealed manner to surface 164, any method known in the industry can be employed. One method which has been shown to be particularly useful in providing a hermetic seal between cover member 162 and body member 160 has been to use a vacuum brazing technique where a bead of brazing material is provided along surface 164 of body member 160, cover member 162 is provided on surface 164 with the brazing bead sandwiched between members 162 and 160 and then the component assembly is subjected to extremely high heat thereby causing a brazing function to occur. Other securing methods are contemplated.

As illustrated, each of body member 160 and cover member 162 form a plurality of apertures (not separately numbered) for receiving mechanical components such as screws, bolts, etc., for mounting device packages 90, 92, 94 and 96 and, perhaps, other electronic devices, to the sink member 102. In addition, body member 160 and/or cover member 162 may include other apertures for mounting other converter components (e.g., the bracket described below) to sink member 102 and/or to mount the sink member 102 within a converter housing for support.

Referring once again to FIG. 2 and also to FIG. 5, capacitors 50 are standard types of capacitors and, to that end, generally include a cylindrical body member having a first end 220 and a second end 222 opposite the first end 220 where terminals 224 and 226 extend from each first end 220 and a heat conducting extension 228 (see FIG. 5) extends centrally from each second end 222. The heat conducting extensions 228, as the label implies, conducts most of the heat from the central core of the capacitor. Each capacitor 50 has a length dimension L1 which separates the first and second ends 220 and 222.

Referring now to FIGS. 2, 4 and 5, bracket member 104 is, in at least one embodiment, formed of a heat conducting, rigid material such as aluminum or copper. Bracket member 104 includes a proximal member 230, an intermediate member 232 and a distal member 234. Proximal member 230 includes a flat elongated member which has a length substantially equal to the length of sink member 102. Proximal member 230 forms a plurality of mounting apertures along its length which align with similar apertures (not illustrated) in the surface 142 formed by cover member 162 (see again FIG. 3).

Intermediate member 232 forms a 90° angle with proximal member 230 and extends from one of the long edges of member 230. Similarly, distal member 234 extends from the long edge of intermediate member 232 opposite the edge linked to proximal member 230 and forms a 90° angle with intermediate member 232. The 90° angle formed between intermediate member 232 and distal member 234 is in the direction opposite the angle formed between proximal member 230 and intermediate member 232 so that distal member 234 extends, generally, in a direction opposite the direction in which proximal member 230 extends. Although not illustrated, distal member 234 forms a plurality of apertures through which the heat dissipating capacitor extension members 228 extend for mounting the capacitors 50 thereto. In the illustrated embodiment, distal member 234 forms two rows of substantially equi-spaced apertures for receiving the capacitors 50 and arranging the capacitors 50 in two separate rows.

Referring again to FIGS. 2, 4 and 5, laminated bus bar 106 includes a substantially planar member having a general shape similar to the shape of distal member 134. Although not illustrated, it should be appreciated by one of ordinary skill in the art that laminated bus bar 106 includes several metallic conducting layers where adjacent layers are separated by insulating layers and wherein different ones of a conducting layers are linked to connecting terminals along one edge of the bus bar. Exemplary connecting terminals are identified by numeral 240 in FIGS. 2 and 4.

In addition, although not illustrated, separate vias are provided in an underside of bus bar 106 which facilitate connection of particular points and particular conducting laminations within bar 106 to the capacitors juxtaposed thereunder when the converter assembly is configured. More specifically, referring to FIGS. 1a and 1b once again, bus bar 106 links various emitters and collectors of the switching devices 30–41 and 61–72 to the positive and negative DC buses separated by the capacitors 50 as illustrated. Thus, for example, bus bar 106 links the collector of switch 30 to the positive DC bus 18, the emitter of switch 36 to the negative DC bus, the collector of switch 31 to the positive DC bus 18, the emitter of switch 37 to the negative DC bus 20, and so on.

It should be appreciated that bus bar 106 can have an extremely simple and hence minimally expensive construction when used with a sink and switching device configuration that aligns all intra-converter connection terminals in a single line and in a single connection plane. Here only a minimal number of laminate layers are required and no vias are required to link to the switching devices as connection terminals 240 are within the same plane as the device terminals.

With the converter components configured as described above, a particularly advantageous converter assembly can be assembled as follows. First, after the cover member 62 has been hermetically sealed to body member 160, device packages 90, 92, 94 and 96 are mounted to mounting surface 140 of sink member 102 so as to form a single device row as illustrated best in FIG. 4. Next, bracket member 104 is secured to surface 142 of cover member 102 so that intermediate member 232 generally extends away from sink member 102 and so that distal member 234 also extends generally away from sink member 102. Capacitors 50 are next mounted to distal member 234 with their extending heat dissipating extensions 228 passing through apertures in member 234 and so that the capacitors 50 form two capacitive rows as illustrated in FIGS. 2 and 5.

At this point, it should be appreciated that, when bracket member 104 is suitably dimensioned, the connection terminals 224 and 226 that extend from the first ends 220 of the capacitors 50 should be within the same connection plane as the intra-converter connection terminals extending toward the capacitors 50 from each of device packages 90, 92, 94 and 96. To this end, the bracket member 232 should be chosen such that the length dimension L2 of intermediate member 232, when added to the sink member thickness T3 and the device thickness T1 (not illustrated), essentially equals the capacitor length L1. When any of the sink member 102, the capacitors 50 or the device packages (e.g., 90) are replaced by other components having different dimensions, the differently dimensioned components can be accommodated and the capacitor and device package connecting terminals can be kept within the same plane by selecting a bracket member 104 having a different intermediate member 232 length dimension L2. Thus, the bracket-sink member assembly renders the sink member extremely versatile when compared to previous sink configurations that required multi-plane serpentine coolant paths.

With the capacitor connecting terminals and the intra-converter terminals extending from the device packages within the same connection plane, planar and relatively simple bus bar 106 is attached to the capacitor and intra-converter terminals thereby linking the various terminals to the positive and negative buses 18 and 20 in the fashion illustrated in FIGS. 1a and 1b above.

Continuing, the input and output bus bars 12', 14', 16', 24', 26' and 28' are next linked to the inter-converter connection terminals as illustrated in FIG. 4 and to link the emitters and capacitors of the switching devices 30–41 and 61–72 at the common nodes (e.g., 46, 80, etc.) as illustrated in FIGS. 1a and 1b.

Referring now to FIG. 5, when all of the components described above are secured together in the manner taught, an extremely compact converter assembly that requires a relatively small volume is configured. In fact, as illustrated, a space 280 is formed adjacent surface 142 of cover member 162 and adjacent intermediate member 232 where additional components such as the components required to configure controller 22 can be mounted. In some embodiments, at least some of the components of controller 22 will be mounted within cooling space 280 to a second mounting surface formed by surface 142 of cover member 162 so that the mounted components dissipate heat into sink member 102.

Referring again to FIGS. 3 and 6, with cover member 162 secured to surface 164, when liquid is pumped through inlet 200 and into inlet chamber 192, after chamber 192 fills with liquid, the liquid is forced through each of restricted nozzle inlets 194 and 196 into opposite sides of cavity 166 (i.e., into different halves of cavity 166 where the halves are separated by central dividing member 180). Because the nozzle passageways 194 and 196 are restricted, the coolant is forced therethrough under pressure which should overcome any pressure differential that exists within the opposite sides of cavity 166. As the liquid passes through cavity 166 on its way to and out outlet 202, the liquid heats up between first channel end 184 and second channel end 186 and a phase change occurs wherein at least a portion of the liquid, as heat is absorbed, changes from the liquid state the state gas thereby forming bubbles within cavity 166.

Protuberances 290 cause excessive amounts of turbulence within cavity 166 as the protuberances 290 redirect liquid along random trajectories within the channels. The excessive turbulence within cavity 166 is such that essentially no gas pockets form on the internal surfaces of the cavity 166 or the portion of cover member 162 enclosing cavity 166. In embodiments where sink member 102 is vertically aligned, bubbles that form within the cavity float upward under the force of liquid flow and the force of their own buoyancy. The bubbles proceed out the outlet 202 and are thereafter condensed by the cooling system attached thereto as the refrigerant is cooled.

In FIG. 6, as indicated above, cavity 166 has a width dimension W4 that is, at least in one embodiment, similar to the width dimension W2 of the heat generating portion of device or package surface 122 (see also FIG. 3). Where dimension W2 is smaller, it is contemplated that the dual channel aspect of cavity 166 may not be required. For example, assume dimension W2 is half the dimension illustrated in the figures. In this case, the cavity 166 may be made approximately half the illustrated dimension and hence central member 180 may not be needed.

Experiments have shown that if width dimension W4 is too large and no dividers 180 are provided along the cavity length L4, the turbulence generated by the protuberances 290 is substantially reduced. Thus, for instance, assume member 180 were removed from cavity 166. In this case much of the coolant pumped into cavity 166 through passageways 194 and 196 would pass relatively calmly through to the outlet end 186 of cavity 166. The maximum width of each channel formed within cavity 166 is going to be a function of various factors including cavity depth, coolant employed, coolant pressure, the quantum of heat generated by device packages mounted to the sink, etc.

It should be appreciated that the protuberances 290 and divider 180 within cavity 166 are specifically provided to increase channel turbulence to a level that eliminates gas pockets on channel surfaces. Without gas pockets on the channel surfaces, refrigerant/coolant is in substantially full contact with all channel surfaces and the temperature differential between the first and second channel ends 184 and 186 is substantially reduced. The smaller channel temperature differential means that devices mounted to sink member 102 have more similar operating characteristics as desired.

Figure 9:
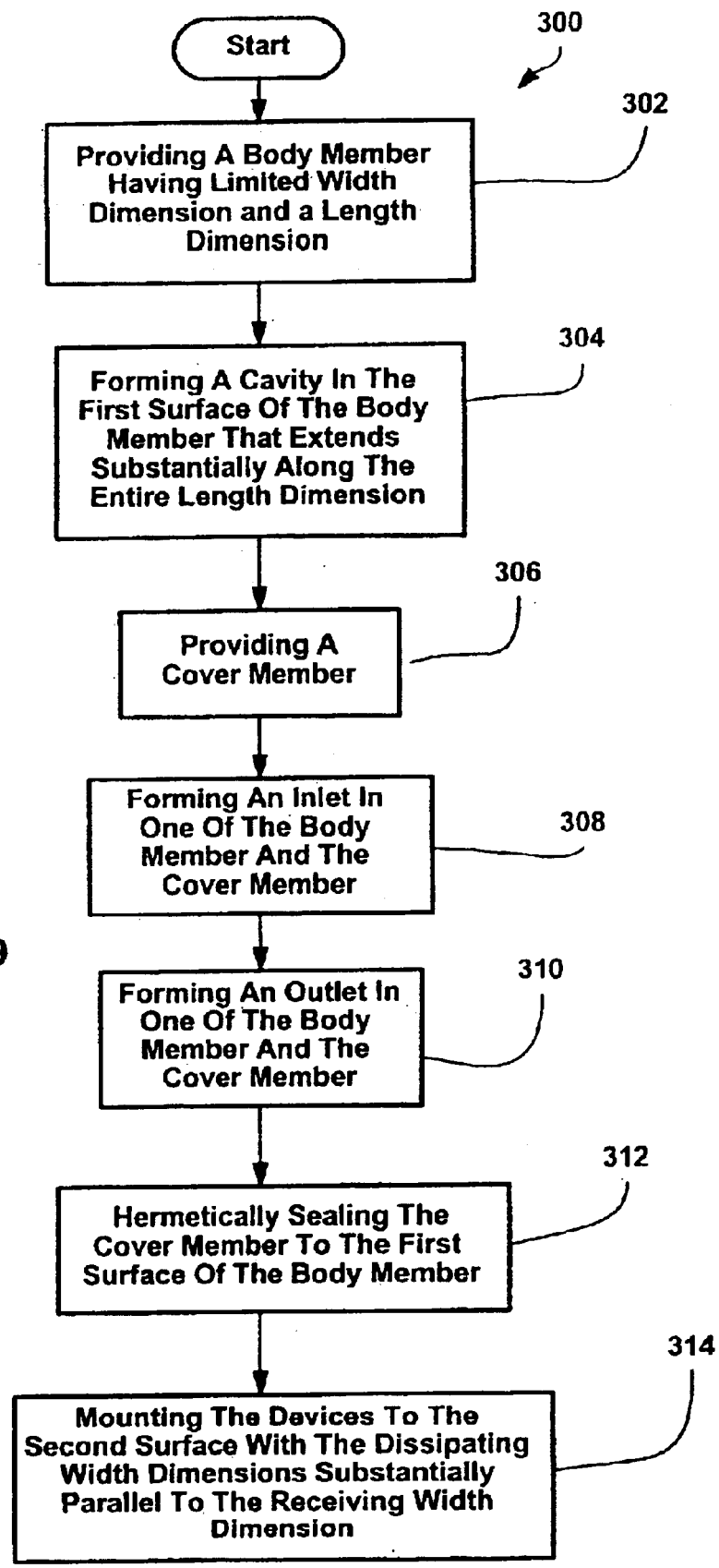
FIG. 9 is a flow chart according to one aspect of the present invention.

Referring now to FIG. 9 a method 300 according to one aspect of the present invention is illustrated. Here, at block 302, a body member 160 (see again FIG. 3) having a limited width dimension W3 and a length L5 is provided where the limited width dimension is substantially similar to or identical to the width dimension W1 of the devices to be attached thereto. At block 304, a cavity is formed in a first surface of the body member 160 that extends substantially along the entire length dimension L5. The cavity is illustrated as 166 in FIG. 3. At block 306, a cover member 162 is provided that is consistent with the teachings above. At block 308 an inlet is formed in one of the body member and the cover member. At block 310 an outlet is formed in one of the body member and the cover member. As above, the inlet and outlet formed should open into opposite ends of the cavity or channel 166. At block 312, the cover member 162 is hermetically sealed in any manner known in the art to the body member 160 thereby providing an enclosed channel having only a single inlet and a single outlet at opposite ends. Continuing, at block 314, power switching devices for packages 90, 92, 94 and 96 are mounted to the second or mounting surface with their dissipating width dimensions substantially parallel to the receiving width dimension W3 of the heat sink.

While the system described above includes four separate power switching device modules, two modules configured to provided a rectifier and two modules configured to provide an inverter, it should be appreciated that other applications may require more or less power capability. Where less power is required, if suitable, only two power switching device modules may be required. In this case, the heat sink member 102 may be made relatively shorter so as to, generally, accommodate the two modules. Where more power capability is required, in at least some applications, because a temperature differential may occur if an excessive number of modules are aligned along a relatively long length heat sink member, if will be desirable to provide more than one heat sink member like member 102. In this case, two or more sink members may be aligned essentially end to end with the switching device modules on each of the members aligned in a single line or, in the alternative, two sink members may be vertically aligned so as to be substantially parallel to each other. In either of these two cases, a single bracket member and a single laminated bus bar may be configured to link all of the module switching devices and capacitors together thereby forming a suitable converter topology.

Figure 10A:
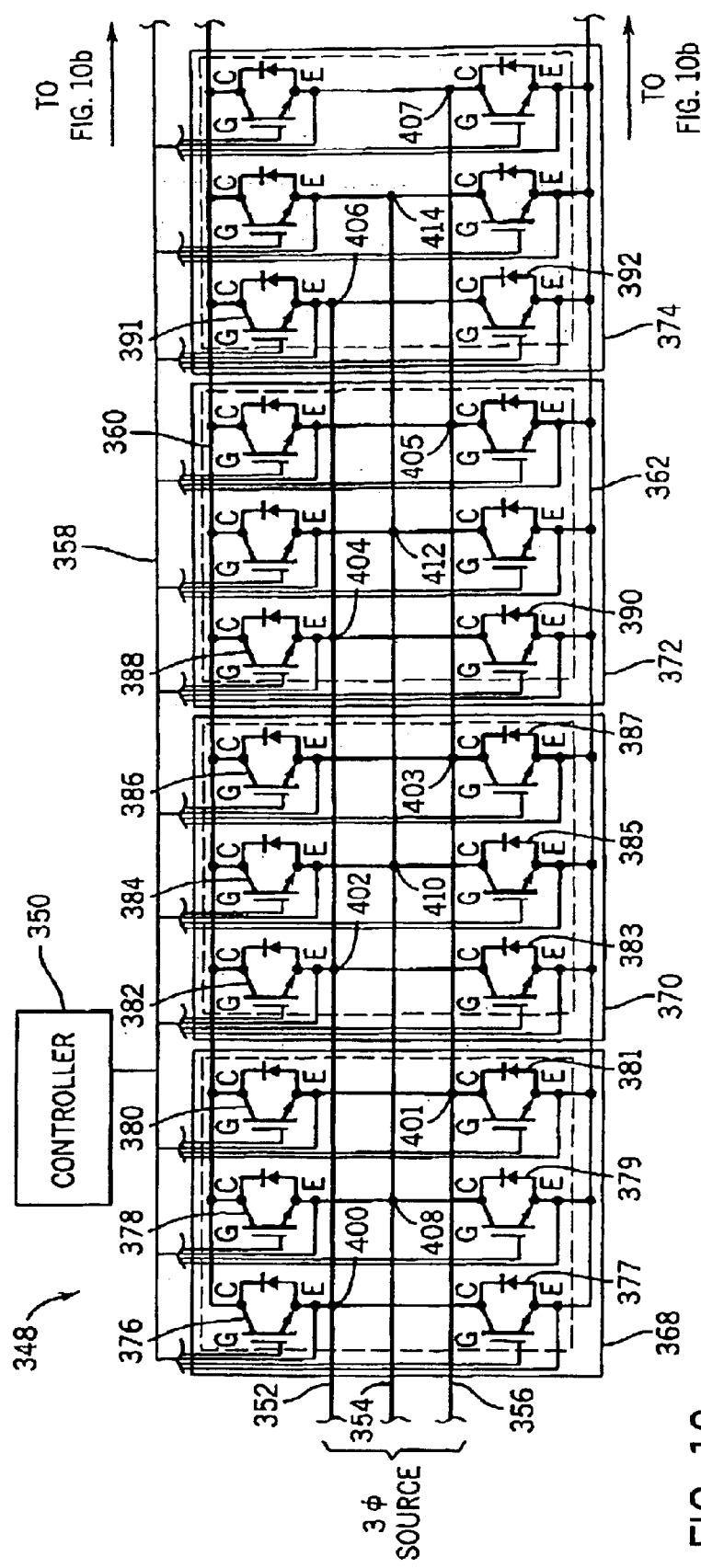
Figure 10B:
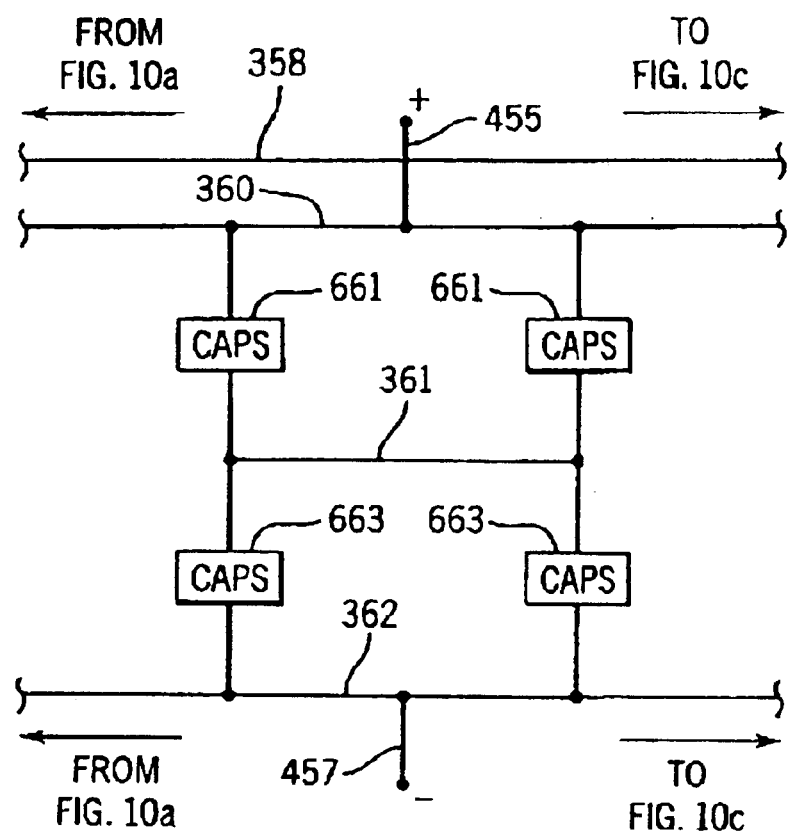
FIG. 10b is a schematic diagram of a inverter configuration.
Figure 10C:
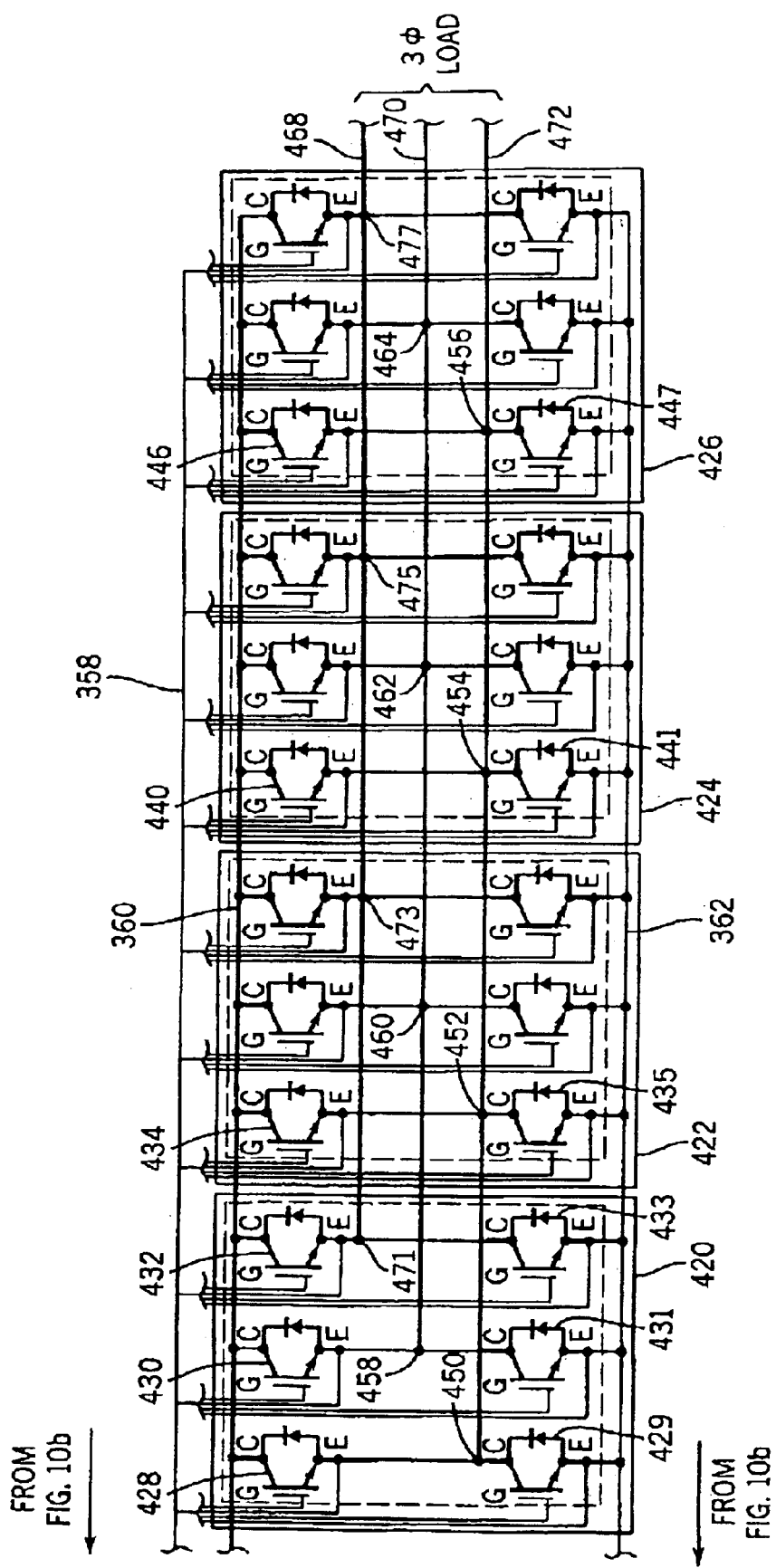

Referring now to FIGS. 10a, 10b and 10c, a relatively high power embodiment of the present invention will be described in the context of an exemplary motor control system 348 including a rectifier assembly generally illustrated in FIG. 10a which feeds a capacitor bank in FIG. 10b and an inverter assembly generally illustrated in FIG. 10c where each of the rectifier and inverter are controlled by a controller 350. As known in the controls industry, the rectifier (FIG. 10a) receives three-phase AC voltage on input lines 352, 354, and 356 and converts that three-phase voltage to a DC potential across positive and negative DC buses 360 and 362, respectively. The DC buses 360 and 362 generally feed the capacitive bank (FIG. 10b) and the inverter configuration (see again FIG. 10c) which converts the DC potential to three-phase AC voltage waveforms that are provided to a three-phase load via first, second and third inverter output lines 468, 470 and 472, respectively.

The rectifier assembly in FIG. 10a includes first through fourth separate power switching device modules 368, 370, 372 and 374 where each of the switching device modules includes six separate power switching devices. For example, module 368 includes switching devices 376–381, module 370 includes switching devices 382–387 and so on. First and second switching devices in module 372 are identified by numerals 388 and 390 and first and second switching devices in module 374 are identified by numerals 391 and 392, respectively. The switching devices are arranged between the positive and negative DC buses 360 and 362, respectively, to provide 12 separate rectifier legs. Each rectifier leg includes a pair of series connected switching devices that traverse the distance between the positive and negative DC buses 360 and 362, respectively. For example, a first rectifier leg includes an upper switch 376 and a lower switch 377 that are in series between positive bus 360 and negative bus 362, a second rectifier leg includes an upper switch 378 and a lower switch 379 that are in series between buses 360 and 362, and so on. Each power switching device module 368, 370, 372 and 374 includes first, second and third rectifier legs or switch pairs. Hereinafter, the labels first, second and third switch pairs will be used to refer the left most, center and right most switch pairs on each of modules 368, 370, 372 and 374. For example, referring still to FIG. 10a, switches 376 and 377 will be referred to as the first switch pair of module 368, switches 378 and 379 will be referred to as the second switch pair of module 368 and switches 380 and 381 will be referred to as the third switch pair of module 368. Similarly, switch pairs 382 and 383, 384 and 385 and 386 and 387 will be referred to as the first, second and third switch pairs of module 370, and so on.

The nodes between switches in each device pair are referred to as common nodes (i.e., a node that is common to the switch pair). A common node between switches 376 and 377 is identified by numeral 400, a common node between switches 378 and 379 is identified by numeral 408 and the common node between switches 380 and 381 is identified by numeral 401. The common nodes for the first, second and third switch pairs in module 370 are identified by numerals 402, 410 and 403, respectively, the common nodes for the first, second and third switch pairs in module 372 are identified by numerals 404, 412 and 405 and the common nodes for the first, second and third switch pairs in module 374 are identified by numerals 406, 414 and 407, respectively.

Each of input lines 352, 354, and 356 is separately linked to four different common nodes where each node is from a different one of the modules and no common node is linked to more than one input line. For example, as illustrated, line 352 is linked to common nodes 400, 402, 404 and 406. In a similar fashion, input line 354 is linked to common nodes 408, 410, 412 and 414 while input line 356 is linked to common nodes 401, 403, 405 and 407. As described above with respect to FIGS. 1a and 1b, switch emitters, collectors and gates are identified via E, C and G labels, respectively, in FIG. 10a (as well as in FIG. 10c described below).

Control bus 358, which represents a plurality of different control lines, links controller 350 separately to each one of the rectifier switches for independent control. Controller 350 controls when each of the switches turns on and when each of the switches turns off. Switch pairs having their common nodes linked to the same input line are controlled in identical fashion by controller 350.

Referring to FIG. 10b, the rectifier configuration also includes first and second sets or pluralities of capacitors 661, 663 linked between the positive and negative DC buses 360 and 362. More specifically, the capacitors include a first upper set 661 linked between positive DC bus 360 and a neutral bus 361 and a second lower set 663 linked between negative DC bus 362 and neutral bus 361.

Referring now to FIG. 10c, the inverter configuration illustrated, like the rectifier configuration of FIG. 10a, includes first through fourth separate power switching device modules 420, 422, 424, and 426 (also, sometimes referred to fifth through eighth modules, respectively) where each module includes six separate power switching devices arranged in first, second and third device pairs between the positive and negative DC buses 360 and 362, respectively. For example, module 420 includes a first switch pair including an upper switch 428 and a lower switch 429 arranged between buses 360 and 362, a second switch pair includes an upper switch 430 and a lower switch 431 and a third switch pair includes switches 432 and a lower switch 433. The switches that comprise the first switch pair in module 422 are separately identified by numerals 434 and 435, the switches that comprise the first switch pair in module 424 are separately identified by numerals 440 and 441 while the switches that comprise the first switch pair of module 426 are identified by numeral 446 and 447. As in the case of the rectifier configuration, hereinafter, unless indicated otherwise, the left most, center and right most switch pairs in each of modules 420, 422, 424 and 426 as illustrated in FIG. 10c will be referred to as the first, second and third switch pairs of the respective modules.

In FIG. 10c, the common nodes corresponding to the first switch pairs of each of modules 420, 422, 424, and 426 are identified by numerals 450, 452, 454 and 456. Similarly, the common nodes corresponding to the second switch pairs in each of the modules 420, 422, 424, and 426 are identified by numerals 458, 460, 462 and 464 while the common nodes corresponding to the third switch pairs in each of the modules 420, 422, 424, and 426 are identified by numerals 471, 473, 475 and 477.

In the illustrated embodiment, each output line 468, 470 and 472 is linked to four separate common nodes from different modules. For example, output line 472 is linked to each first switch pair common node including nodes 450, 452, 454 and 456. Similarly, output line 470 is linked to each second switch pair common node including nodes 458, 460, 462 and 464 while line 468 is linked to each third switch pair common node 471, 473, 475 and 477.

Control bus 358 from controller 350 is linked to each of the inverter switches to independently control the turn on and turn off of those switches. As in the case of the rectifier switches illustrated in FIG. 10a, controller 350 controls the switches of the inverter configuration that have common nodes linked to the same output line in identical fashions.

Figure 11:
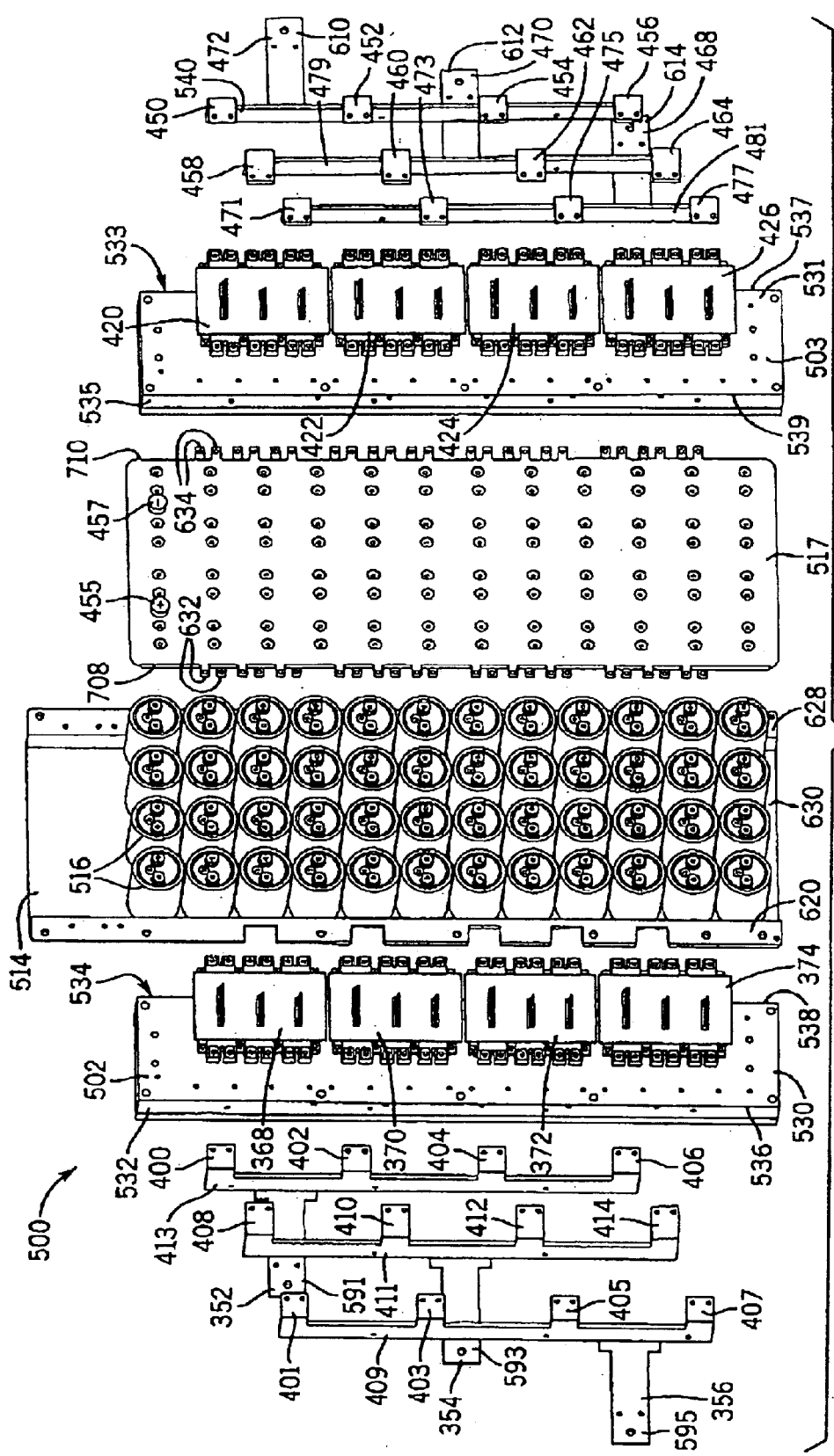
FIG. 11 is an exploded perspective view of a converter assembly according to one embodiment of the present invention.

Referring now to FIG. 11, an exploded perspective view of an exemplary rectifier/inverter configuration 500 that implements the design of FIGS. 10a–10c is illustrated. Configuration 500 includes first and second heat sink member 502 and 503, the eight power switching device modules 368, 370, 372, 374, 420, 422, 424 and 426 briefly described above, a bracket member 514, a plurality of capacitors collectively identified by numeral 516, a laminated bus bar 517 and a plurality of input and output bus bars identified by numerals 352, 354, 356, 468, 470 and 472.

Each of modules 368, 370, 372, 374, 420, 422, 424 and 426 is similarly constructed and, generally, is constructed in a manner similar to the switch packet 90 described above. Thus, each of the modules has a length dimension, a width dimension and a thickness dimension (see again FIGS. 3 and 5) and also has first and second linking edges that face in opposite directions. As in the case of package or module 90, each of the modules in FIG. 11 includes six switching devices arranged in a single row relationship where first and second sub-sets of switching device emitters and collectors extend from opposites sides of the module and are generally separated by the device width. As above, each of the modules in FIG. 11 is designed so that all the emitter and collector terminals extend from the module housing within a single connection plane.

Switching device connection terminals that are linked to any of bus bars 352, 354, 356, 468, 477 or 472 are referred to as inter-converter terminals because after configuration 500 is assembled, those terminals are connected through their respective bus bars to components outside the converter configuration. Similarly, any device package terminals linked to laminated bus bar 517 after configuration 500 is assembled are referred to herein as intra-converter terminals as those terminals are linked to other components within the converter assembly.

Referring still to FIG. 11, after exemplary configuration 500 is assembled, all of the inter-converter terminals of each module mounted to sink member 502 extend in the same direction and from a line to facilitate easy linkage to bus bars and all of the intra-converter connection terminals of each module mounted to sink member 502 extend in the opposite direction and from a line to facilitate easy linkage to bus bar 517 linking tabs. Similarly, after assembly, the inter-converter and intra-converter connection terminals of modules mounted to sink member 503 extend in opposite directions and form inter-converter and intra-converter connection terminal lines to facilitate easy linking to associated bus bars and the bus bar 517 linking tabs, respectively.

Figure 12:
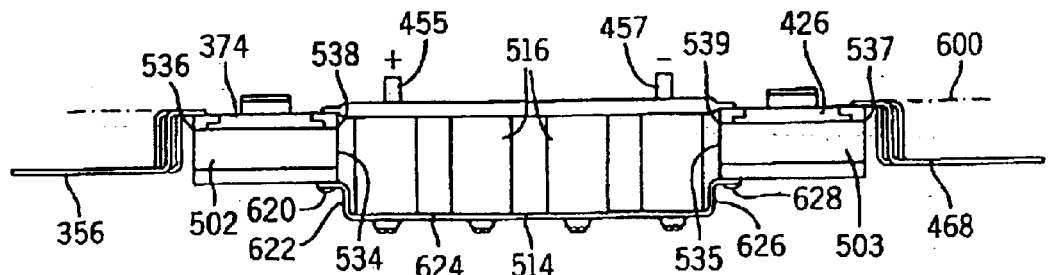
FIG. 12 is a side plan view of an assembled configuration consistent with FIG. 11.
Figure 13:
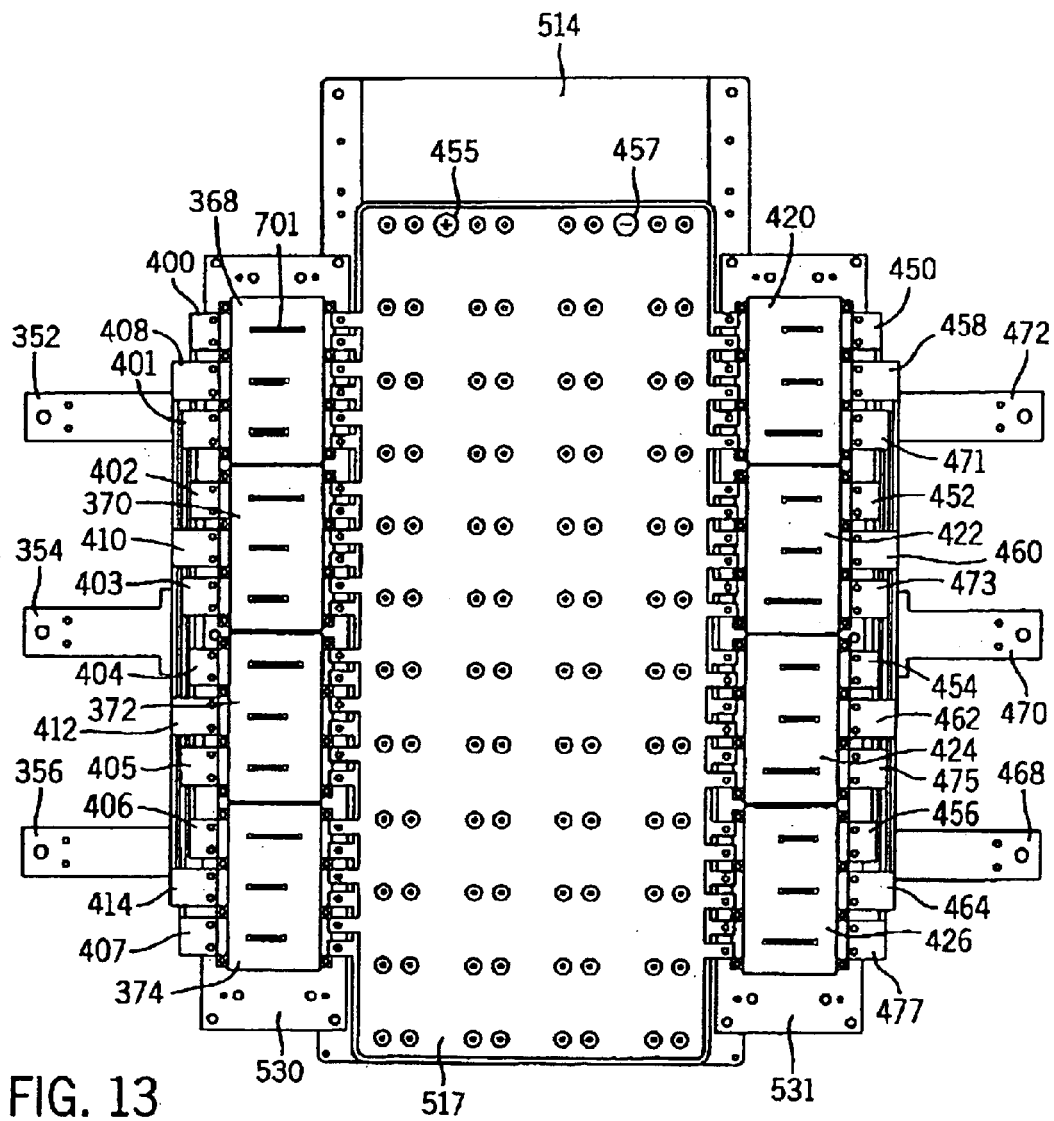
FIG. 13 is a top plan view of the converter configuration of FIG. 12.

Referring still to FIG. 11 and also to FIG. 13, in at lease some embodiments of the present invention, configuration 500 components are juxtaposed such that the intra-converter terminals of the modules mounted to first sink member 502 face the intra-converter terminals that extend from the modules mounted to second sink member 503 while the inter-converter connection terminals of the modules mounted to first sink member 502 extend in an opposite direction from the inter-converter connection terminals of modules mounted to second heat sink member 503. This limitation makes possible a converter configuration where a single and relatively simple laminated bus bar can be used to link the intra-converter terminals as illustrated in FIGS. 10a, 10c, 11, 12 and 13.

Control ports (see 701 in FIG. 13) are provided on a top surface of each power switching device module, (e.g., 368, 370, etc.) to facilitate linking of control bus 358 to the devices provided within the modules. Modules 368, 370, 372, 374, 420, 422, 424, and 426 are mechanically mounted to mounting surfaces of heat sink members 502 and 503 in the manner described above with respect to FIGS. 2 and 3 (e.g., via bolts or the like received in mounting apertures) and therefore will not be described again here in detail.

Referring still to FIG. 11, consistent with the linkage pattern illustrated in FIG. 10a, each of the input bus bars 352, 354 and 356 is a steel bar that has a shape such that the bar is connectable to a separate switching device pair in each of rectifier modules 368, 370, 372 and 374. More specifically, bus bar 352 includes an elongated spine member 413 and four separate rib members that extend therefrom, a separate rib member corresponding to each of rectifier modules 368, 370, 372 and 374. In FIG. 11, the rib members linked to spine member 413 have been labeled with numbers corresponding to the common nodes of the first switching device pairs of each of the rectifier modules in FIG. 10a to highlight the linking relationship between the ribs and the corresponding common nodes. For example, the first rib extending from spine member 413 in FIG. 11 that links to common node 400 in FIG. 10a is similarly identified by numeral 400, the second rib extending from spine member 413 that links to common node 402 in FIG. 10a is similarly identified by numeral 402 and the third and fourth extending ribs that link to common nodes 404 and 406 in FIG. 10a are similarly labeled 404 and 406, respectively. A linking tab 591 extends from spine member 413 generally in a direction opposite the direction of ribs 400, 402, 404 and 406.

Second input bus bar 354, like first bar 352, includes a spine member 411 and first through fourth rib members 408, 410, 412 an 414, respectively, that extend to one side thereof and that are juxtaposed such that, upon assembly, they align with and are linkable to common nodes 408, 410, 412 and 414 of the second switch pairs of each of modules 368, 370, 372 and 374 as illustrated. A linking extension member 593 extends in a direction opposite the ribs from spine member 411.

Third input bus bar 356 includes a spine member 409 and four rib members 401, 403, 405 and 407 that extend to one side thereof and that are juxtaposed such that, upon assembly, they align with and are linkable to similarly numbered common nodes 401, 403, 405 and 407 in FIG. 10a that correspond to the third switching device pairs of each of modules 368, 370, 372 and 374. An input linking extension 595 extends from spine member 409 in a direction opposite the rib members.

Referring still to FIG. 11 and also to FIG. 10c, like input bus bars 352, 354 and 356, output bus bars 468, 470 and 472 each include a spine, four rib members and an oppositely extending extension member for linking to an associated output line. More specifically, bus bar 472 includes spine member 540, first through fourth rib members 450, 452, 454, and 456 that extend in the same direction from, and that are spaced along spine member 540, and extension member 610 that extends in a direction opposite the rib members from spine member 540. Bus bar 470 includes spine member 479, four spaced apart and similarly directed rib members 458, 460, 462 and 464 and extension member 612 and bus bar 468 includes spine member 481, four rib members 471, 473, 475 and 477 and an oppositely extending extension member 614. Rib members 450, 452, 454 and 456 are juxtaposed and spaced apart such that, upon assembly, the rib members align with, and are linkable to, the common nodes of each first switch pair in modules 420, 422, 424, and 426, respectively. To highlight the linkage pattern, rib members 450, 452, 454, 456 are identified by the same numbers as the nodes to which they are linked in FIG. 10c. Similarly, rib members 458, 460, 462, 464, 471, 473, 475 and 477 are juxtaposed and spaced apart such that, upon assembly, the rib members align with, and are linkable to, similarly numbered common nodes in FIG. 10c.

Referring again to FIG. 11 and also, again, to FIGS. 3 and 4, each of heat sink members 502 and 503 is similar to heat sink member 102 described in detail above and therefore, in the interest of simplifying this explanation, will not be described here in detail. However, some simple description of members 502 and 503 will be helpful in explaining relative juxtapositions of assembly 500 components. To this end, sink member 502 includes a mounting surface 530, first and second lateral surfaces 534 and 532, respectively, and first and second lateral edges 538 and 536, respectively. Edge 538 is formed by surfaces 530 and 534 while edge 536 is formed by surfaces 530 and 532. Similarly, member 503 includes a mounting surface 531, first and second lateral surfaces 535 and 533 and first and second lateral edges 539 and 537. First lateral edge 539 is formed by the intersection of surfaces 531 and 535 while second lateral edge 537 is formed by intersection of surface 531 with surface 533.

Referring now to FIGS. 11, 12 and 13, bracket member 514 is, in the illustrated embodiment, formed of a heat conducting rigid material such as aluminum or copper. Member 514 includes first and second proximal or lateral end members 620 and 628, two intermediate members 622 and 626 and a central member 624. Each of first and second end members 620 and 626 includes a flat elongated member which has a length substantially equal to the length of one of heat sink members 502 or 503. Each of members 620 and 628 forms a plurality of mounting apertures along its length which align with similar apertures (not illustrated) in surfaces of sink members 502 and 502 opposite mounting surfaces 530 and 531, respectively.

Intermediate members 622 and 626 form 900 angles with end members 620 and 628, respectively, and extend from one of the long edges of the corresponding end members 620 and 628. Central member 624 forms a bracket mounting surface 630 that is, in the illustrated embodiment, parallel to members 620 and 628 and forms a plurality of apertures (not illustrated) for receiving heat dissipating extension members of each of capacitors 516. In the illustrated embodiment, central member 624 forms four rows of substantially equi-spaced apertures for receiving capacitors 516 and arranging the capacitors 516 in two separate rows.

Figure 17:
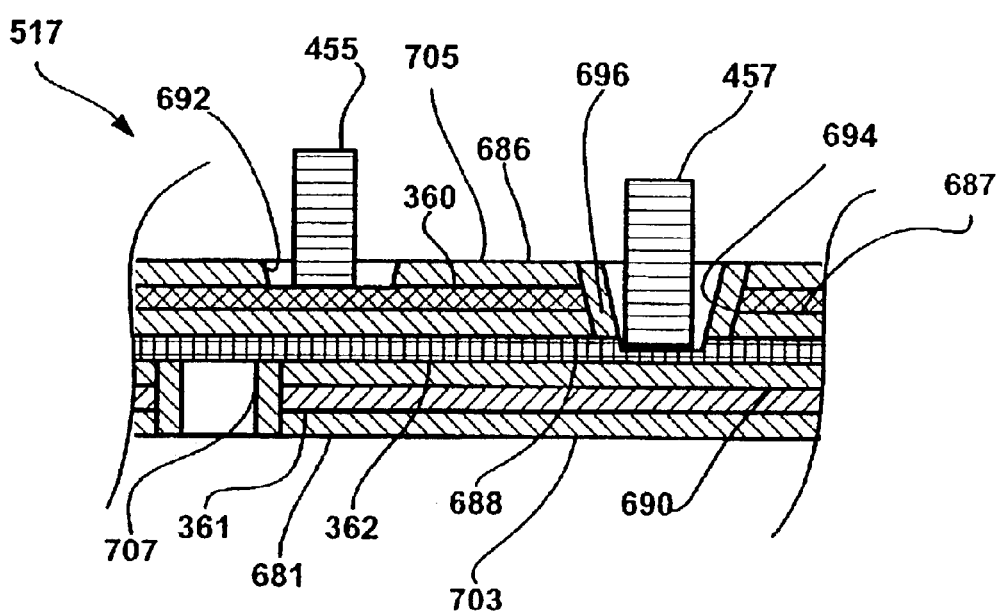
FIG. 17 is a cross-sectional view of a bus bar showing vias and extending external positive and negative linkage terminals.

Referring still to FIGS. 11, 12 and 13, laminated bus bar 517 includes a substantially planar member having a shape similar to the shape of central member 624. Referring also to FIG. 17, laminated bar 517 includes several metallic conducting layers where adjacent layers are separated by insulating layers. In FIG. 17, laminated bar 517 includes four insulating layers (left to right downward cross hatched) 686, 687, 690 and 681, a positive DC bus layer 360, a negative DC bus layer 362 and a neutral bus layer 361. Also shown in FIG. 17 are positive and negative vias and extension terminals 455 and 457 described in greater detail below. Positive bus 360 is insulated between layers 686 and 688, negative bus 362 is insulated between layers 688 and 690 and neutral bus 361 is insulated by layers 690 and 681. Hereafter, insulating layers 681 and 686 will be referred to as first and second external layers, respectively, that form first and second external surfaces 703 and 705, respectively, that face in opposite directions.

Separate insulated via's (e.g., see 707) are provided in an underside of bus bar 517 (e.g., through insulating layer 681)

which facilitate connection of particular conducting laminations within bus bar 517 to capacitor connection terminals juxtaposed thereunder when the converter configuration is assembled.

Referring again to FIGS. 10a and 10c, bus bar 517 links various emitters and collectors of the switching devices in the power switching device modules (e.g., 368, 420, etc.) to the positive and negative DC buses 360 and 362, respectively. For instance, laminated bar 517 links the collector of switch 376 to positive DC bus 360, the emitter of switch 377 to the negative DC bus, the collector of switch 378 to the positive DC bus, the emitter of switch 379 to the negative DC bus, and so on.

Referring again to FIGS. 11 and 13, in addition to the components described above, laminated bar 517 also includes linking constructs, linkages or tabs 623, 634, that extend laterally from first and second linking edges 708 and 710, respectively. The linking edges 708 and 710 are straight and, in the illustrated embodiment, are parallel and comprise opposite edges of bar 517. Because edges 708 and 710 are straight, the linking tabs 632, 634 form first and second linking lines along the edges. First and second subsets of tabs 632, 634 are linked to the positive and negative DC bus layers 360 and 362. The tabs from the first and second sets are arranged and juxtaposed such that, upon assembly, the tabs align with, and are linkable to, intra-converter connection terminals on modules 368, 370, 372, 374, 420, 422, 424 and 426 to link switching devices in the modules to the positive and negative DC buses as illustrated in FIGS. 10a and 10c. Thus, in FIGS. 10a and 10c, laminate bar 517 links all upper switching devices (i.e., devices illustrated above associated common nodes) to positive DC bus 360 and links all lower switching devices (i.e., devices illustrated below associated common nodes) to negative DC bus 362.

As in the embodiment described above with respect to FIGS. 2, 3 and 4, it should be appreciated that bus bar 517 has an extremely simple and hence minimally expensive construction when used with a sink and switching device configuration that aligns all intra-converter connection terminals in two lines and in a single connection plane where the intra-converter connection terminals are located on opposite sides and on opposite edges of the laminated bar 517. Here, despite the large number of power switching devices and high power capabilities, only a minimal number of laminate layers are required and no via's are required to link the switching devices because the connection terminals are all within a single plane and are located at laminate edges.

It should also be appreciated that, when bracket member 514 is suitably dimensioned, the connection terminals that extend from the capacitors 516 will be within the same connection plane as the intra-converter connection terminals extending toward the capacitors 516 from each of modules 368, 370, 372, 374, 420, 422, 424 and 426. Here, bracket member 514 should be designed such that the length dimensions of the intermediate members 622 and 626, when added to the sink member thickness (see again T3 in FIG. 5) and the module thickness (not illustrated) is essentially equal to the capacitor length L1 (see again FIG. 5).

In at least some embodiments it is important that linking edges 708 and 710 of laminated bar 517 face in opposite directions and are parallel. In this regard, as described above, to operate most efficiently, liquid cooled sink members 502 and 503 have to be positioned such that their internal spaces or channels are generally vertically aligned and so that channel inlets are below channel outlets on the same sink member. Thus, by configuring bar 517 with oppositely facing parallel linking edges 708 and 710, the requirement that both sinks 502 and 503 be aligned with their lengths vertical can be met. Nevertheless, other configurations are contemplated where the linking edges may include other than parallel edges.

With the capacitor connection terminals and the intra-converter terminals extending from the device modules within the same connection plane, planar and relatively simple bus bar 517 is attached to the capacitor and intra-converter terminals thereby linking the various terminals to the positive and negative buses 360 and 362 in the fashion illustrated in FIGS. 10a and 10c above.

Next, the input and output bus bars 352, 354, 356, 472, 474 and 476 are linked to the inter-converter connection terminals as illustrated in FIGS. 11 and 13 to link the emitters and collectors of the switching devices at the common nodes as illustrated in FIGS. 10a and 10c.

Once configuration 500 has been assembled, configuration 500 is mounted within the space provided for by a specific application such that the inlet apertures or openings into the internal spaces formed by sink members 502 and 503 are below the outlets corresponding to those spaces, and generally, so that sinks 502 and 503 are substantially vertically aligned. Thus, when cooling liquid is pumped into the inlets at the bottoms of sink members 502 and 503, the cooling liquid moves upward within the internally formed channels and exits the outlets thereabove after absorbing sink and module heat.

Referring once again to FIGS. 10b, 11, 12, 13 and 17, according to an additional aspect of the present invention, positive and negative DC bus tabs or external linkage terminals 455 and 457, respectively, are linked to the positive and negative DC buses 360 and 362, respectively, of the laminated bus bar 517. As best seen in FIG. 17, first and second vias 692 and 694 are formed in laminated bar 517 through second surface 705 that open into or terminate at the positive and negative DC buses 360 and 362, respectively. Via 692 opens through second external insulating layer 686 while via 694 opens through layer 686, DC bus layer 360 and insulating layer 688. The lateral internal walls of via 694 are layered with an insulator 696 to avoid a short between the positive and negative DC buses 360 and 362. Terminals 455 and 457 extend through vias 692 and 694, link to positive and negative DC bus layers 360 and 362 and have exposed distal ends linkable to either a DC source or a load requiring DC power. Terminals 455 and 457, in the illustrated embodiment, extend in a perpendicular direction from the top surface of laminated bar 512 although other extending directions and configurations are contemplated.

With DC bus tabs 455 and 457 extending as illustrated, the configuration described above can be linked to power sources and loads in several different ways and can be controlled by controller 350 in various ways to facilitate several types of power conversion. For example, as described above, a three-phase source can be linked to input lines 352, 354, and 356 and a three-phase load can be linked to output lines 468, 470 and 472 and controller 350 can control modules 368, 370, 372 and 374 to facilitate rectification while controlling modules 420, 424, 424 and 426 to facilitate inversion to provide a three-phase AC/AC converter. As another example, with a three-phase AC source linked to input lines 352, 354 and 356, controller 350 may control modules 368, 370, 372 and 374 to rectify the AC power and provide a DC source on positive and negative DC buses 360 and 362 and thereby to positive and negative DC terminals 455 and 457. Here, a load requiring DC voltage may be linked to terminals 454 and 457 to receive power therefrom. As another example, a first three-phase source may be provided at input lines 352, 354 and 356 while a second three-phase source is provided at lines 468, 4670 and 472 and controller 350 may be used to control all of modules 368, 370, 372, 374, 420, 422, 424 and 426 to facilitate rectification thereby providing a higher DC power at tabs 455 and 457.

In yet another example, a separate DC source that is not illustrated may be linked to terminals 455 and 457, a first AC load may be linked to lines 352, 354 and 356, the second three-phase AC load may be linked to lines 468, 470 and 472 and controller 350 may control modules 368, 370, 372 and 374 as well as modules 420, 422, 424 and 426 to provide DC/AC power conversion. Thus, it the positive and negative DC terminals 455 and 457 linked to the DC buses formed by laminated bar 517 appreciably increase the versatility of the relatively complex and large scale conversion configuration illustrated in FIGS. 10a through 13.

Referring still to FIG. 11, by linking each of the input and output bus bars 352, 354, 356, 468, 470 and 472 to switch pairs in each power switching device module (e.g., 368, 370, etc.), the disparate operating ranges of power switching devices in different modules average and the overall conversion that occurs yields for better results.

The advantages of having input and output bus bars that are linked to power switching devices in each of a plurality of different power switching device modules are obtainable in any configuration where the switches in two power switching device modules are to be controlled together to provide either rectification or inversion. For example, referring again to FIG. 1a and FIG. 2, input bus bars 12', 14' and 16' may each be shaped and configured such that input line 16 is linked to the common nodes between switches 30 and 36, and switches 33 and 39, line 14 is linked to the common nodes switches 31 and 37 and switches 34 and 40 and line 12 is linked to the common nodes between switches 32 and 38 and switches 35 and 41, assuming switching devices 30, 31, 32, 36, 37 and 38 are on a first power switching device module and devices 33, 34, 35, 39, 40 and 41 are on a second power switching device module. Similar comments are applicable to the inverter configuration illustrated in FIG. 1b where each of lines 24, 26 and 28 may be linked to first and second common nodes where the first and second common nodes correspond to switch pairs on different device modules.

Figure 14:
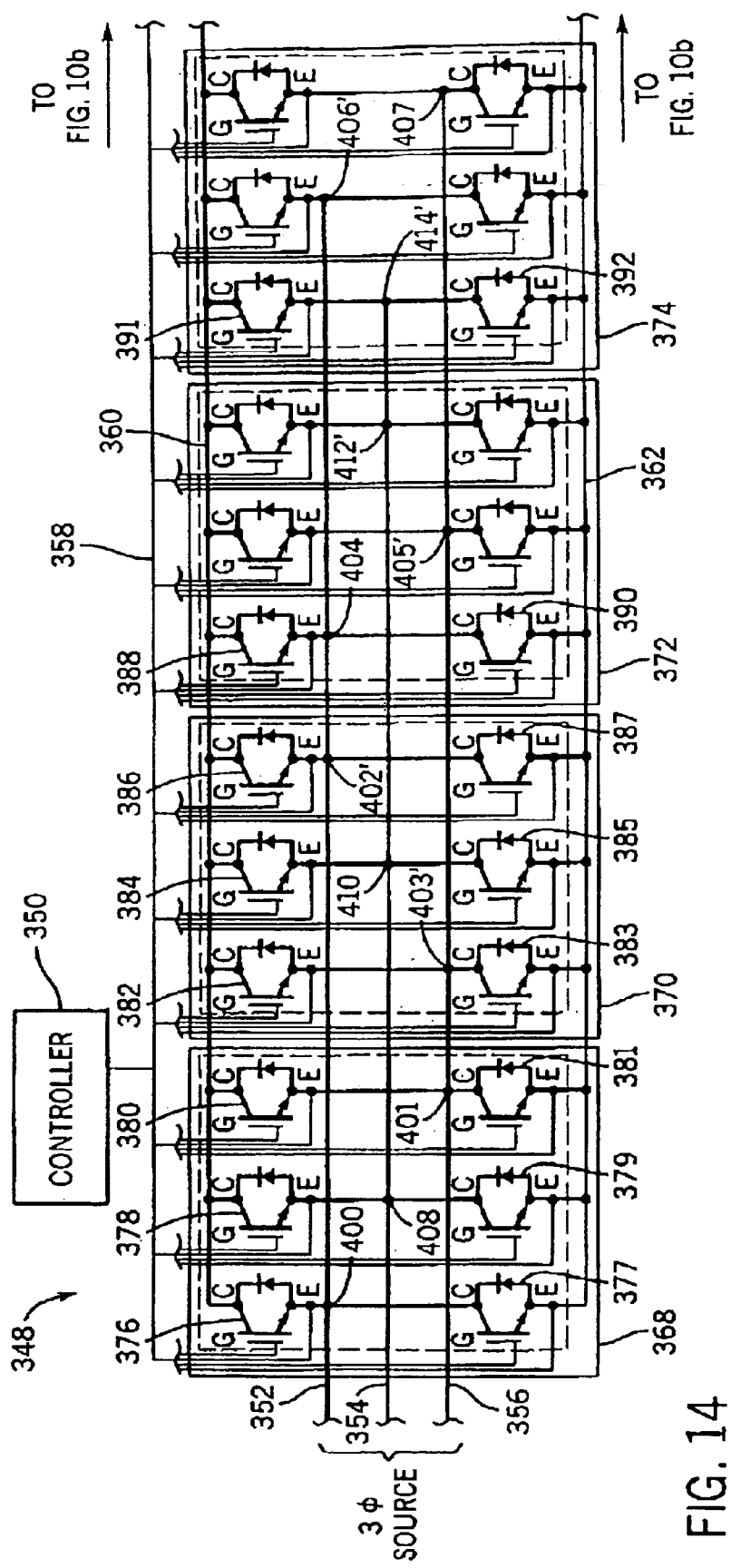
FIG. 14 is a schematic diagram similar to the diagram illustrated in FIG. 10a, albeit illustrating a different linkage pattern of input lines to common nodes.

Other bus bar configurations, in addition to those illustrated in FIGS. 11–13 above, are contemplated that provide similar multi-modular switch averaging results. To this end, the components illustrated in FIG. 10a have been re-illustrated in FIG. 14, the only difference being the linking pattern between input lines 352, 354 and 356 and the switch pair common nodes. Specifically, comparing FIGS. 10a and 14, where a node linkage appearing in FIG. 10a has been altered in FIG. 14, the altered linkage in FIG. 14 is identified by the same number used to label the linkage in FIG. 10a followed by a "'". For example, common node 402 in FIG. 10a, which is linked to input line 352 has been replaced in FIG. 14 by similarly numbered common node 402' (e.g., the common node of the third switch pair including switches 386 and 387 in module 370). Similarly, common node 406 linked to line 352 in FIG. 10a has been replaced in FIG. 14 by similarly numbered common node 406', the common node formed by the second switch pair in module 374.

In FIG. 14, first input line 352 is linked to common node 400 corresponding to the first switching device pair in module 368, the common node 402' corresponding to the third switching device pair in module 370, the common node 404 corresponding to the first switching device pair in module 372 and common node 406' corresponding to the second switching device pair in module 374. In addition, line 354 is linked to the common node 408 corresponding to the second switching device pair in module 368, the common node 410 corresponding to the second switching device pair in module 370, the common node 412' corresponding to the third switching device pair in module 372 and the common node 414' corresponding to the first switching device pair in module 374. In addition, third input line 356 is linked to the common node 401 corresponding to the third switching device pair in module 368, common node 403' corresponding to the first switching device pair in module 370, common node 405' corresponding to the second switching device pair in module 372 and common node 407 corresponding to the third switching device pair in module 374.

As illustrated in FIG. 14, each of the lines 352, 354 and 356 is linked to at least two adjacent common nodes where the adjacent common nodes are in different power switching devices modules. For example, line 352 is linked to common node 402' in module 370 and is also linked to adjacent common node 404' in module 372. Similarly, line 354 is linked to common node 412' in module 372 and also to adjacent common node 414' in module 374 while line 356 is linked to common node 401 in module 368 and to common node 403' in module 370.

Figure 15:
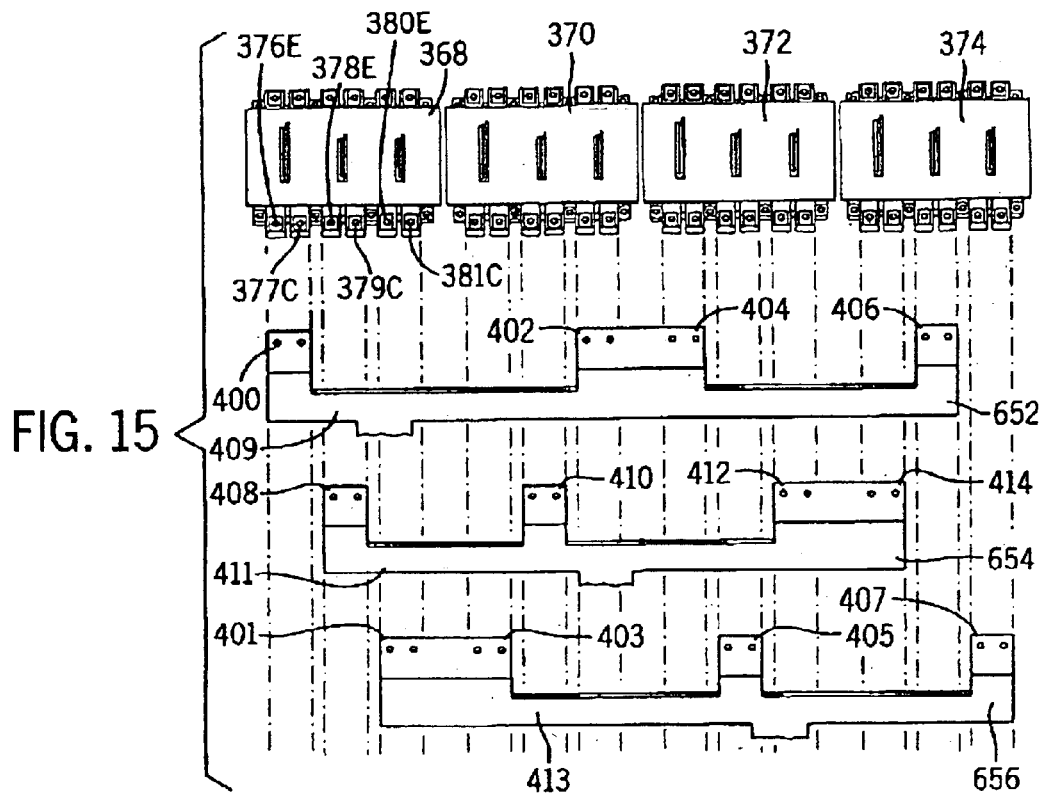
FIG. 15 is a schematic diagram illustrating switching modules and a second bus bar embodiment.

Referring now to FIG. 15 and also to FIG. 11, modules 368, 370, 372 and 374 are re-illustrated in FIG. 15 and a second embodiment of bus bars for linking to switching modules as shown in FIG. 14 is illustrated. Like bars 352, 354 and 356 in FIG. 11, bars 652, 654, 656 each include a spine member 409, 411 and 413, respectively, and a plurality of rib members which extend in the same direction therefrom. However, instead of including four rib members, each of bars 352, 354 and 356 includes only three rib members. For example, bar 352 includes a first rib member 400, a second "double-wide" rib member identified by both numerals 402' and 404 and a third rib members identified by number 406'.

Referring still to FIG. 15, bar 654 includes first rib member 408, second rib member 410 and a third double-wide rib member identified by numerals 412' and 414' while third bar 656 includes a first double-wide rib member identified by numerals 401 and 403', a second rib member 405' and a third rib members 407'. In FIG. 15, bars 652, 654, 656 are juxtaposed with respect to modules 368, 370, 372 and 374 such that the rib members of each bar are aligned with the intra-converter switching device connection terminals that the bar links up with upon assembly of an associated converter configuration. To this end, it can be seen that rib member 400 links to connection terminals 376E and 377C, rib member 408 links to connection terminals 378E and 379C, rib member 401 links to connection terminals 380E and 381C and so on.

Each double-wide rib member links to a switching device pair in each of two adjacent power switching device modules to perform the function of two of the rib members in the embodiment illustrated in FIG. 11. For example, the double-wide rib member identified by numerals 402' and 404 straddles adjacent switch pairs in modules 370 and 372 to perform the linking functions corresponding to similarly numbered common nodes 402' and 404' in FIG. 14. Similarly, double-wide rib member identified by numerals 412' and 414' straddles adjacent switching pairs in modules 372 and 374 to perform the linking function associated with similarly marked common nodes 412' and 414' in FIG. 14 while the double-wide rib member identified by numerals 401 and 403' straddles the switch pairs in modules 368 and 370 thereby performing the linking function corresponding to common nodes 401 and 403' in FIG. 14. Each single wide rib (e.g., 400, 406, etc.) member in FIG. 15 is juxtaposed with respect to an associated double-wide rib member such that the single-wide member links to a switch pair in a module other than a module to which the associated double-wide rib member is linked. For instance, consistent with FIG. 14, rib member 400 is juxtaposed to link to the first switch pair of module 368 while rib member 406' is juxtaposed to link to the third switch pair of module 374. Thus, the FIG. 15 bus bar configuration provides a function identical to the function of the bus bars illustrated in FIG. 11 where each bus bar 652, 654 and 656 is linked to four separate switch pairs, each linked pair from a different one of modules 366, 370, 372 and 376.

Figure 16:
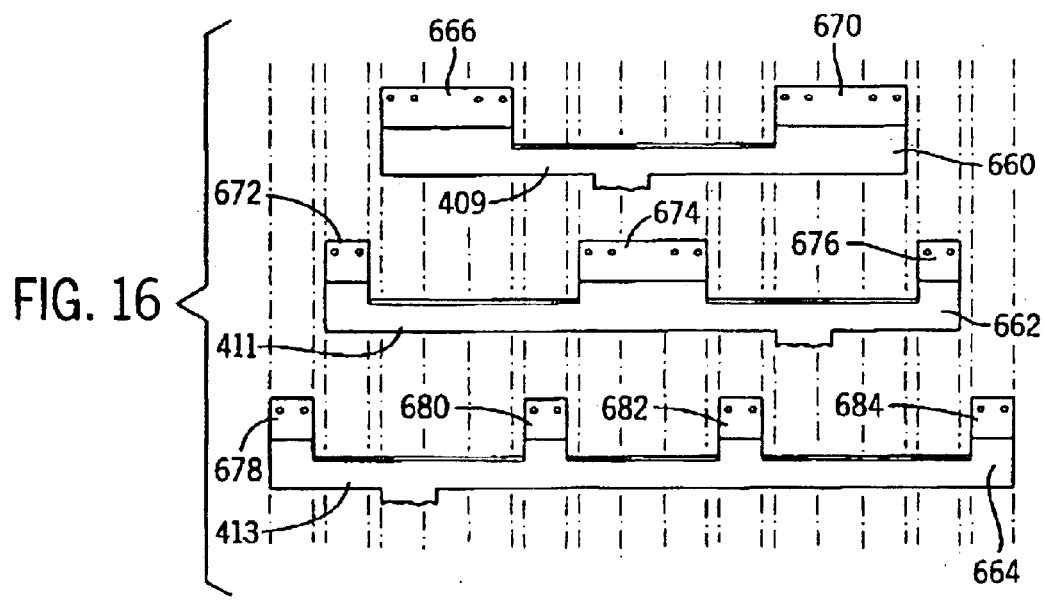
FIG. 16 is similar to FIG. 15, albeit illustrating a third embodiment of an inventive bus bar configuration.

Referring next to FIG. 16, a third bus bar embodiment is illustrated which includes bus bars 660, 662 and 664 that align with modules 368–374 in FIG. 15 in a different fashion but that nevertheless perform functions identical to the bus bars illustrated in FIG. 11. Bars 660, 662 and 664, each include a single spine member 409, 411 and 413, respectively. However, instead of including identical numbers of rib members, each of bus bars 660, 662 and 664 includes a different number of rib members. Bus bar 660 includes first and second double-wide rib members 666 and 670, bar 662 includes first, second and third rib members 672, 674 and 676 where member 674 is double-wide and bar 664 includes first through fourth single-wide rib members 678, 680, 682 and 684, respectively. Rib member 666 is formed so as to straddle adjacent switch pairs in modules 368 and 370 while rib member 670 is sized and positioned with respect to rib member 666 such that, when rib member 666 straddles the adjacent switch pairs in modules 368 and 370, rib member 670 straddles adjacent switch pairs in modules 372 and 374. Second bus bar rib member 674 is sized so as to straddle the connection terminals of adjacent switch pairs in modules 370 and 372 while each of rib members 672 and 676 is sized and juxtaposed with respect to rib member 674 such that, when rib member 674 straddles adjacent switch pairs in modules 370 and 372, rib member 672 is linkable to one pair of switching devices in module 368 and rib member 676 is linkable to one pair of switching devices in module 374. Rib members 678, 680, 682 and 684 are sized and juxtaposed with respect to each other such that each of those rib members links to a separate pair of switching devices in each of modules 368, 370, 372 and 374 that is not linked to one of the other rib members corresponding to either of bars 660 or 662. Thus, as in the cases of the bar configurations of FIGS. 11 and 15, each bar in FIG. 16 links to a separate switch pair in each of modules 368, 370, 372 and 374.

Although not illustrated, it should be appreciated that bus bars similar to the bars illustrated in FIGS. 15 and 16 may be used to replace bars 468, 470 and 472 in FIG. 11 to provide an identical switch averaging function.

Figure 18:
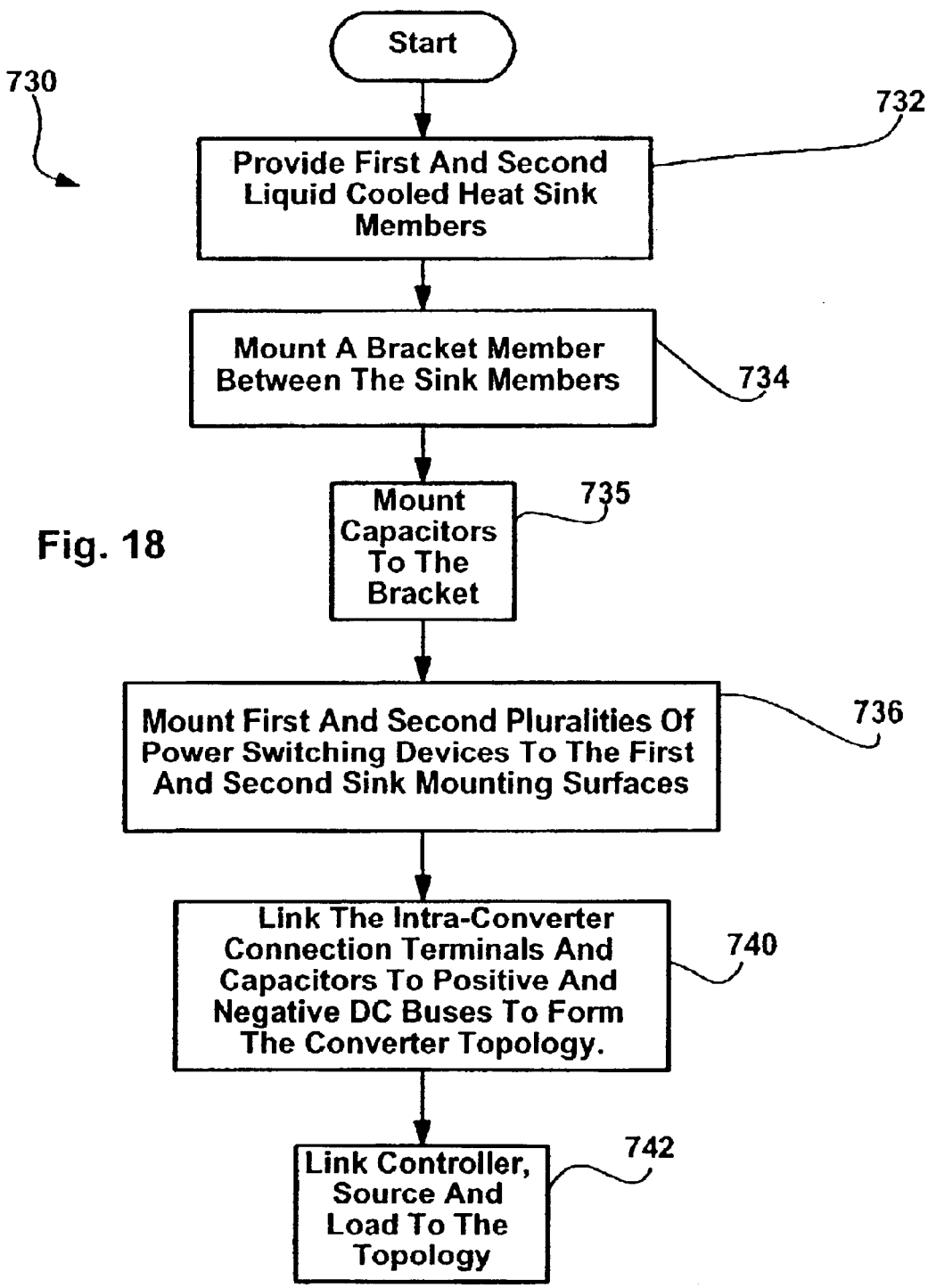
FIG. 18 is a flow chart illustrating a method of configuring a versatile converter topology according to the one aspect of the present invention.

While various configurations and assemblies are described above, it should be appreciated that the present invention also contemplates a method of configuring a simple yet extremely power conversion configuration that is relatively inexpensive to manufacture. To this end, one exemplary method 730 is illustrated in FIG. 18. Referring to both FIGS. 11 and 18, at block 732, first and second liquid cooled heat sink members 502 and 503 are provided having mounting surfaces 530 and 531, respectively, and having length dimensions (not labeled in FIG. 11) where each mounting surface includes first and second oppositely facing edges. For example, sink member 502 includes oppositely facing first and second edges 538 and 536, respectively, while sink member 503 includes oppositely facing first and second edges 539 and 537, respectively. Referring also to FIGS. 3 and 6, each of sink members 502 and 503 forms an internal chamber that extends from an inlet to an outlet for guiding cooling liquid during sink operation.

At block 734, mounting bracket 514 is mounted between the sink members such that the sink member length dimensions are substantially parallel (e.g., first edges 538 and 539 of sink members 502 and 503 are substantially parallel). At block 735, capacitors 516 are mounted to the mounting surface 630 of bracket 514. At block 736, first and second pluralities of switching devices are mounted to the first and second sink member mounting surface 502 and 503 such that their intra-converter and inter-converter connection terminals are proximate the first and second edges of the respective mounting surfaces. For instance, referring once again to FIG. 11, the first plurality of switches may include the switches that form modules 368, 370, 372 and 374 while the second plurality may include the switches that comprise modules 420, 422, 424 and 426.

At block 740 laminated bus bar 517 is used to link the intra-converter connection terminals and the capacitors to the positive and negative DC buses within the laminate bus bar to form the converter topology desired. Next, at block 742, controller 350, a source and a load are linked to the topology. This linking step at block 742 may comprise providing and linking input and output bus bars as illustrated in FIG. 11 and then linking the source and the load lines to the bus bars.

Figure 7:
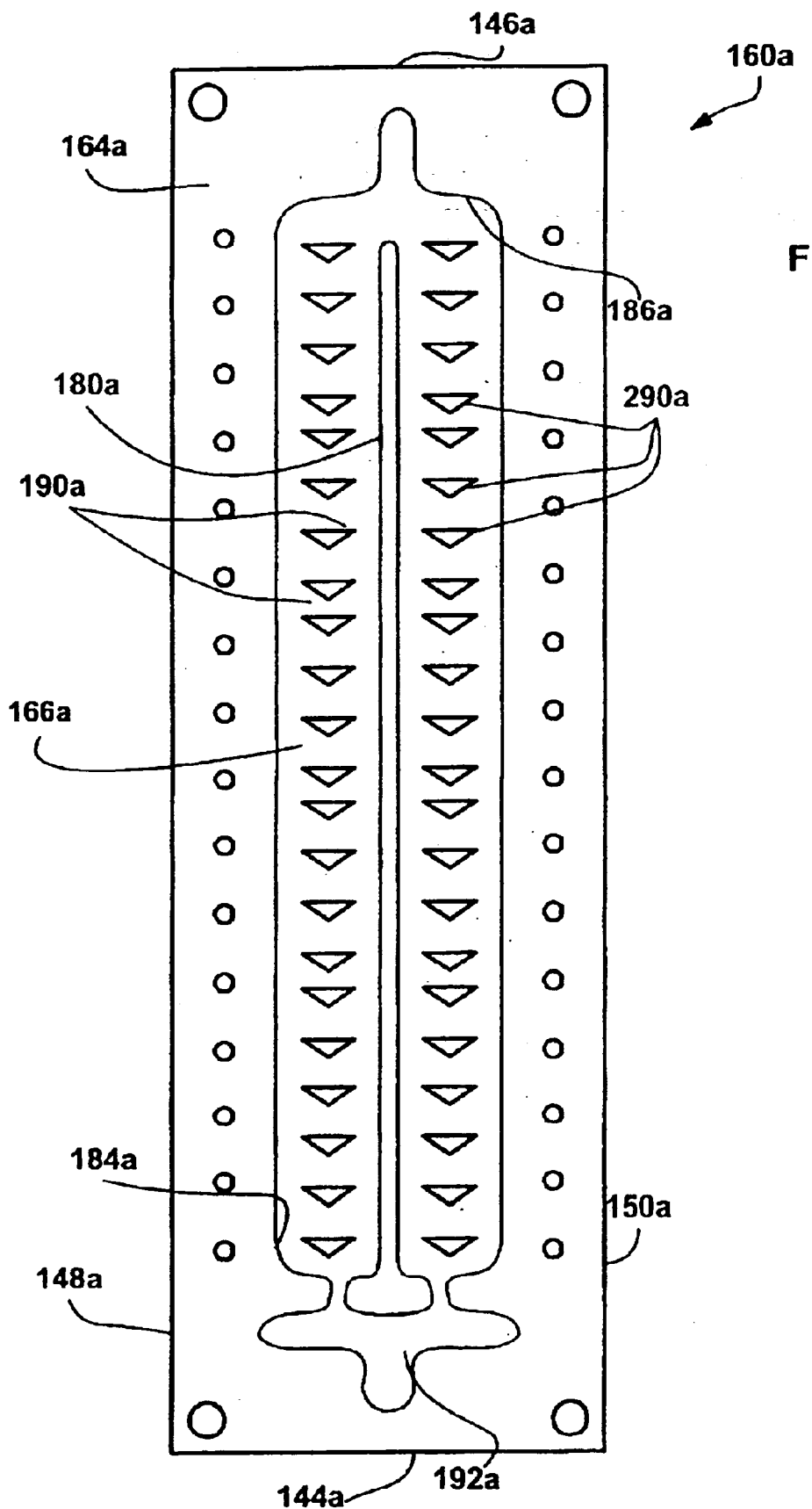
FIG. 7 is similar to FIG. 6, albeit illustrating a second embodiment of the body member.

It should be understood that the methods and apparatuses described above are only exemplary and do not limit the scope of the invention, and that various modifications could be made by those skilled in the art that would fall under the scope of the invention. For example, while the sink member 102 is described as being formed of two components other configurations are contemplated. In addition, the protuberances 290 may take other forms that cause a suitable amount of turbulence within the channel. For instance, in FIG. 7 another embodiment of the body member is illustrated. In FIG. 7 components similar to the components of FIG. 6 are identified by identical numbers followed by an "a" qualifier. In FIG. 7, instead of providing substantially rectilinear protuberances as in FIG. 6, triangular protuberances 290a are provided on either side of member 280. Moreover, the protuberances may be formed by any channel surface although forming the protuberances on the surface opposite the heat generating devices (i.e., opposite the mounting surface) increases the total surface area proximate the heat generating device that is in contact with the coolant. Furthermore, both the cover and the body member may form protuberances and, in some embodiments, the cover member may form part or all of the cavity 166.

In addition, while the protuberances 290 are illustrated as being equi-spaced, equi-spacing is not required and, in fact, it may be advantageous to provide protuberances that cause a greater amount of turbulence at the outlet end of the channel than at the inlet end as the coolant at the outlet end could be slightly warmer and hence could generate more problematic vapor bubbles.

Moreover, more than one divider may be provided in a cavity. In this regard, referring to FIG. 8, another inventive embodiment 160b of the body member is illustrated. In FIG.

Figure 8:
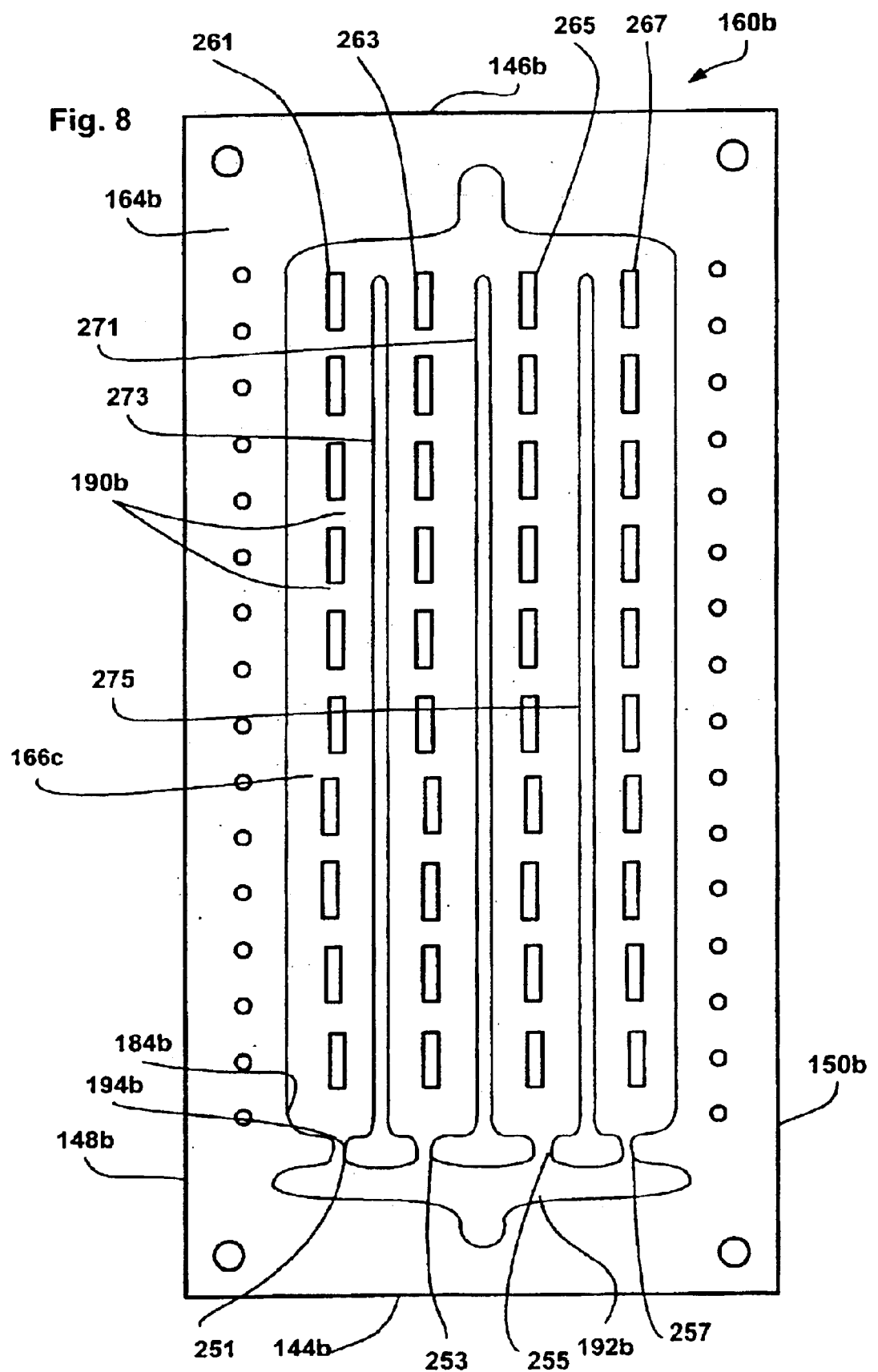
FIG. 8 is similar to FIG. 6, albeit illustrating yet one other embodiment of the body member.

8 components similar to components described above are identified by the same number followed by a "b" qualifier. In FIG. 8 cavity 166b is twice as wide as the cavity 166 in FIG. 6. Here, to ensure sufficient turbulence to eliminate stagnant gas pockets from the cavity surface, three separate divider members 271, 273 and 275 are provided that equally divide cavity 166b along its width. In addition, separate inlet passageways 251, 253, 255 and 257 are provided that open from inlet chamber 192c into each separate channel within cavity 166b and separate lines of protuberances 261, 263, 265 and 267 are formed within the separate channels. Thus, the protuberance concept has application in wider sink assemblies also although it is particularly advantageous in long sink assemblies for the reasons described above.

In addition, while the sinks are described as being substantially vertically aligned and the channels as being parallel to the mounting surfaces, in some embodiments the sinks may be a few degrees (e.g., 10–15) from vertical and the channels may not be completely parallel to mounting surfaces. Furthermore, referring again to FIG. 17, terminals 455 and 457 may not be included in some embodiments while in other embodiments vias 692 and 694 may provide the DC linking functionality alone. Moreover, while embodiments are described above where switching device modules configure each of an inverter sub-assembly and a rectifier sub-assembly, other embodiments are contemplated where the modules may configure only a rectifier or only an inverter assembly.

Figure 19:
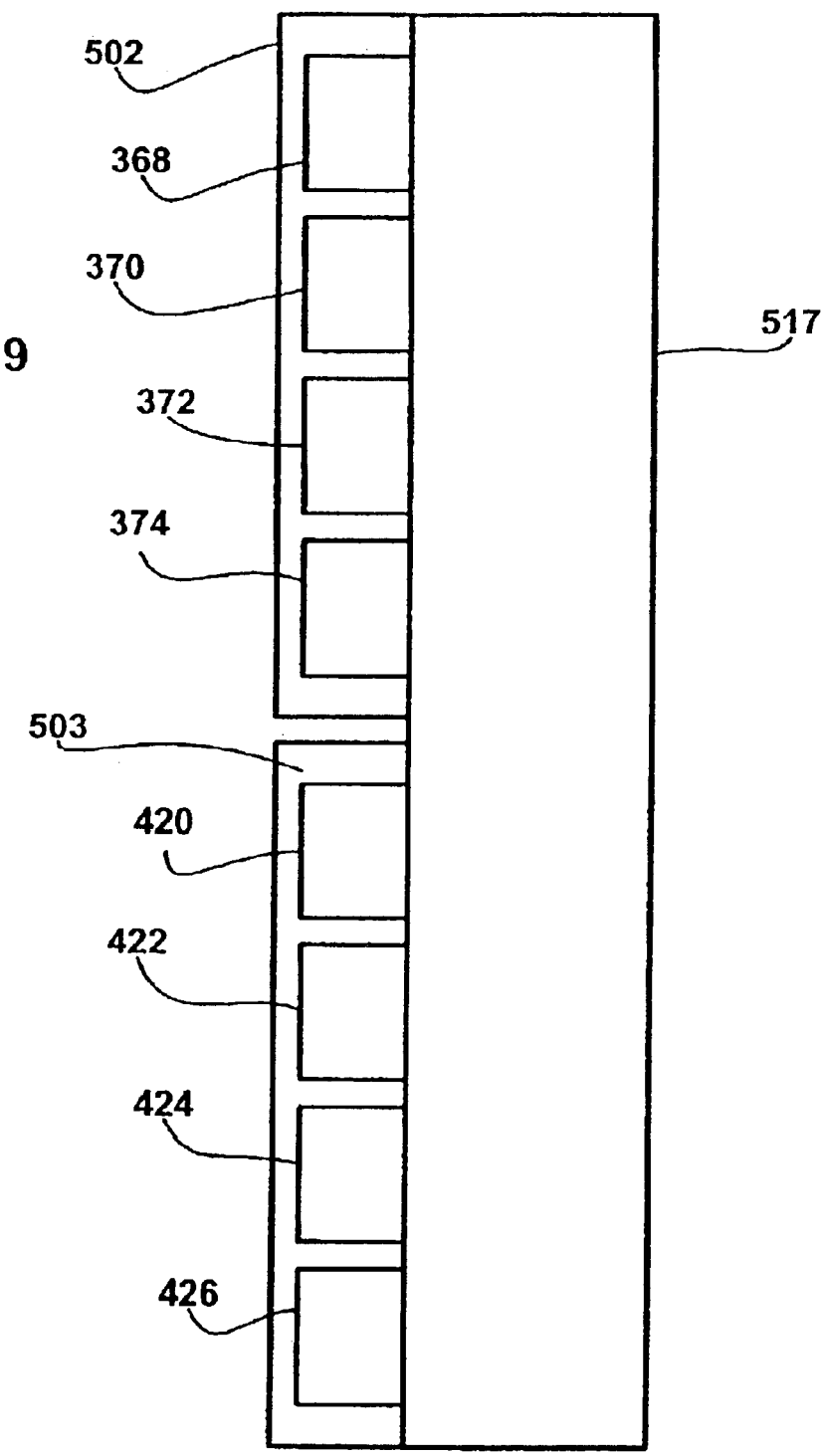
FIG. 19 is a schematic top plan view diagram of an additional converter configuration according to one aspect of the present invention.

In addition, other embodiments are contemplated including two or more vertically aligned liquid cooled sinks combined with a laminated bus bar where the laminated bar links to power switching devices along only vertical straight bar edges. For instance, one additional embodiment is illustrated in FIG. 19 where sinks 502 and 503 with modules 368, 370, 372, 374, 420, 422, 424, and 426 mounted thereto are vertically end aligned with switching devices linked to one straight vertical linking edge of bus bar 517.

To apprise the public of the scope of this invention, the following claims are made:

What is claimed is:

1. An apparatus for linking together power switching devices having intra-converter connection terminals to form a power conversion assembly, the apparatus comprising:
   a planar bus bar including positive and negative DC bus layers and insulating layers that insulate each of the DC bus layers, the bar also including at least a first external insulating layer that forms a first external surface of the bar, the bar also forming at least first and second linking edges; and
   first and second pluralities of linkages formed along the first and second linking edges, respectively, each linkage linked to one of the positive and negative DC bus layers and configured to be linkable to at least one of the power switching device intra-converter connection terminals.

2. The apparatus of claim 1 wherein each of the linkages is a linking tab.

3. The apparatus of claim 1 wherein first and second edges of the bus bar face in opposite directions.

4. The apparatus of claim 3 wherein the bus bar is substantially rectilinear.

5. The apparatus of claim 3 wherein the first and second edges are straight and wherein the first plurality of linkages are aligned along the first straight edge and the second plurality of linkages are aligned along the second straight edge.

6. The apparatus of claim 5 wherein the first and second linking edges are vertically aligned.

7. The apparatus of claim 1 further including first and second external linking vias open to the positive and negative DC bus layers, respectively.

8. The apparatus of claim 7 also for linking a plurality of capacitors to the switching devices wherein the external linking vias open through the fist external insulating layer and wherein the laminated bar further includes a second external insulating layer on a side opposite the first external insulating layer and forms a plurality of vias opening through second external insulating layer to the positive and negative DC bus layers, the capacitors linkable through the plurality of vias to the DC bus layers.

9. The apparatus of claim 7 further including positive and negative DC connection terminals that extend through the first and second vias and are linked to the positive and negative DC bus layers, distal ends of the DC connection terminals exposed and connectable to at least one of a DC source and a DC load.

10. The apparatus of claim 1 for linking at least first and second bridge assemblies together with the capacitors to form a conversion device and, wherein, each of the linkages in the first plurality is linked to at least one of the intra-converter connection terminals of the first bridge assembly and each of the linkages in the second plurality is linked to at least one of the intra-converter connection terminals of the second bridge assembly.

11. A three phase electronic converter assembly comprising:
   at least a first heat sink member having a mounting surface;
   first and second X phase converter bridge assemblies, each bridge assembly including a plurality of power switching devices, the first bridge assembly forming first through Xth external linkage terminals and the second bridge assembly forming (X+1)th through 2Xth external linkage terminals, each linkage terminal linkable to one phase of at least one of an X phase source and an X phase load, the switching devices mounted to the mounting surface of the at least first sink member;
   a plurality of capacitors; and
   a bus bar including a positive DC bus, a negative DC bus and a plurality of insulating layers that insulate the positive and negative DC buses and form an external insulating layer, the capacitors and each of the bridge assemblies linked to the positive and negative DC buses, the bar forming first and second external linking vias that open to the positive and negative DC buses, respectively.

12. The apparatus of claim 11 further including a positive DC bus connection terminal linked to the positive DC bus and having a distal end extending through the first via and exposed for external connection and a negative DC connection terminal linked to the negative DC bus and having a distal end extending through the second via and exposed for external connection.

13. The apparatus of claim 12 wherein the bus bar is planar proximate the first and second vias and wherein each of the positive and negative connection terminals extend substantially perpendicularly to the bus bar plane proximate the vias.

14. The apparatus of claim 13 including a second sink member having a mounting surface and, wherein, the first bridge assembly is mounted to the mounting surface of the first sink member and the second bridge assembly is mounted to the mounting surface of the second sink member.

15. The apparatus of claim 14 further including a bracket member rigidly linked to and between the first and second sink members, the plurality of capacitors mounted to the bracket member substantially between the first and second sink members.

16. The apparatus of claim 15 further including a controller for controlling each of the first and second bridge assemblies to operate as at least one of a rectifier and an inverter.

17. The apparatus of claim 15 wherein the first bridge assembly includes at least first and second three phase converter bridges and the second bridge assembly includes at least first and second three phase converter bridges.

18. The apparatus of claim 11 wherein X is 3.

19. The apparatus of claim 18 wherein the first three phase converter bridge assembly includes power switching devices that form at least first and second three phase bridges and the second three phase converter bridge assembly includes power switching devices that form at least first and second three phase bridges, each of the three phase bridges including three pairs of switching devices, each of the switching device pairs including an upper switching device and a lower switching device, each device including intra-converter connection terminals and inter-converter connection terminals, the linkage assembly linking the intra-converter connection terminals of each of the upper devices to the positive DC bus and linking the intra-converter connection terminals of each of the lower switching devices to the negative DC bus, the inter-converter connection terminals forming the first through third external linkage terminals of the first bridge assembly and forming the fourth through sixth external linkage terminals of the second bridge assembly.

20. The apparatus of claim 11 wherein the first bridge assembly includes at least first and second three phase converter bridges and the second bridge assembly includes at least first and second three phase converter bridges.

21. The apparatus of claim 9 wherein the sink member is a liquid cooled heat sink.

22. A three phase electronic converter assembly comprising:

a first heat sink member having a mounting surface;

a second heat sink member having a mounting surface;

first and second X phase converter bridge assemblies, each bridge assembly including a plurality of power switching devices, the first bridge assembly forming first through Xth external linkage terminals and the second bridge assembly forming (X+1)th through 2Xth external linkage terminals, each linkage terminal linkable to one phase of at least one of an X phase source and an X phase load, the first assembly switching devices mounted to the first sink member mounting surface and the second assembly switching devices mounted to the second sink member mounting surface;

a plurality of capacitors;

a bus bar including a positive DC bus, a negative DC bus and a plurality of insulating layers that insulate the positive and negative DC buses and form an external insulating layer, the capacitors and each of the bridge assemblies linked to the positive and negative DC buses, the external insulating layer forming first and second vias that open to the positive and negative DC buses, respectively.

23. The apparatus of claim 22 further including a positive DC bus connection terminal linked to the positive DC bus and having a distal end extending through the first via and exposed for external connection and a negative DC connection terminal linked to the negative DC bus and having a distal end extending through the second via and exposed for external connection.

24. The apparatus of claim 23 wherein the bus bar is planar proximate the first and second vias and wherein each of the positive and negative connection terminals extend substantially perpendicularly to the bus bar plane proximate the vias.

* * * * *